(12) United States Patent
Marx et al.

(10) Patent No.: US 8,710,599 B2
(45) Date of Patent: Apr. 29, 2014

(54) MICROMACHINED DEVICES AND FABRICATING THE SAME

(75) Inventors: David Lambe Marx, Pleasanton, CA (US); Cenk Acar, Irvine, CA (US); Sandeep Akkaraju, Charlestown, MA (US); Janusz Bryzek, Oakland, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 431 days.

(21) Appl. No.: 12/849,787

(22) Filed: Aug. 3, 2010

(65) Prior Publication Data

US 2011/0031565 A1 Feb. 10, 2011

Related U.S. Application Data

(60) Provisional application No. 61/273,494, filed on Aug. 4, 2009, provisional application No. 61/273,538, filed on Aug. 4, 2009.

(51) Int. Cl.
*H01L 29/84* (2006.01)
(52) U.S. Cl.
USPC ........................ 257/417; 257/E29.325; 438/51
(58) Field of Classification Search
USPC .............. 257/417, E21.499, E29.324; 438/51
See application file for complete search history.

(56) References Cited

U.S. PATENT DOCUMENTS

| 5,487,305 | A | 1/1996 | Ristic et al. |
| 5,723,790 | A | 3/1998 | Andersson |
| 5,751,154 | A | 5/1998 | Tsugai |
| 5,760,465 | A | 6/1998 | Alcoe et al. |
| 6,214,644 | B1 | 4/2001 | Glenn |
| 6,351,996 | B1 | 3/2002 | Nasiri et al. |
| 6,366,468 | B1 * | 4/2002 | Pan ............................. 361/761 |
| 6,390,905 | B1 * | 5/2002 | Korovin et al. .............. 451/286 |
| 6,501,282 | B1 | 12/2002 | Dummermuth et al. |
| 6,504,385 | B2 | 1/2003 | Hartwell |
| 6,553,835 | B1 | 4/2003 | Hobbs et al. |

(Continued)

FOREIGN PATENT DOCUMENTS

| CN | 101270988 A | 9/2008 |
| CN | 101426718 A | 5/2009 |

(Continued)

OTHER PUBLICATIONS

U.S. Appl. No. 12/849,742, filed Aug. 3, 2010, Micromachined Inertial Sensor Devices.

(Continued)

*Primary Examiner* — Tuan N Quach
(74) *Attorney, Agent, or Firm* — Schwegman, Lundberg & Woessner, P.A.

(57) ABSTRACT

Micromachined devices and methods for making the devices. The device includes: a first wafer having at least one via; and a second wafer having a micro-electromechanical-systems (MEMS) layer. The first wafer is bonded to the second wafer. The via forms a closed loop when viewed in a direction normal to the top surface of the first wafer to thereby define an island electrically isolated. The method for fabricating the device includes: providing a first wafer having at least one via; bonding a second wafer having a substantially uniform thickness to the first wafer; and etching the bonded second wafer to form a micro-electromechanical-systems (MEMS) layer.

10 Claims, 14 Drawing Sheets

(56) References Cited

U.S. PATENT DOCUMENTS

| | | | |
|---|---|---|---|
| 6,722,206 B2 | 4/2004 | Takada | |
| 6,725,719 B2 | 4/2004 | Cardarelli | |
| 6,781,231 B2 | 8/2004 | Minervini et al. | |
| 6,848,304 B2 | 2/2005 | Geen | |
| 7,051,590 B1 | 5/2006 | Lemkin et al. | |
| 7,093,487 B2 | 8/2006 | Mochida | |
| 7,166,910 B2 | 1/2007 | Minervini et al. | |
| 7,202,552 B2 | 4/2007 | Zhe et al. | |
| 7,210,351 B2 | 5/2007 | Lo et al. | |
| 7,221,767 B2 | 5/2007 | Mullenborn et al. | |
| 7,240,552 B2 | 7/2007 | Acar et al. | |
| 7,258,011 B2 | 8/2007 | Nasiri et al. | |
| 7,258,012 B2 | 8/2007 | Xie | |
| 7,293,460 B2 | 11/2007 | Zarabadi et al. | |
| 7,301,212 B1 | 11/2007 | Mian et al. | |
| 7,305,880 B2 | 12/2007 | Caminada et al. | |
| 7,358,151 B2 | 4/2008 | Araki et al. | |
| 7,436,054 B2 | 10/2008 | Zhe | |
| 7,449,355 B2* | 11/2008 | Lutz et al. | 438/50 |
| 7,518,493 B2 | 4/2009 | Bryzek et al. | |
| 7,539,003 B2 | 5/2009 | Curtis | |
| 7,600,428 B2 | 10/2009 | Robert et al. | |
| 7,622,782 B2 | 11/2009 | Chu et al. | |
| 7,706,149 B2 | 4/2010 | Yang et al. | |
| 7,781,249 B2 | 8/2010 | Laming et al. | |
| 7,795,078 B2 | 9/2010 | Ramakrishna et al. | |
| 7,950,281 B2* | 5/2011 | Hammerschmidt | 73/504.04 |
| 8,006,557 B2 | 8/2011 | Yin et al. | |
| 8,113,050 B2 | 2/2012 | Acar et al. | |
| 8,171,792 B2 | 5/2012 | Sameshima | |
| 8,201,449 B2 | 6/2012 | Ohuchi et al. | |
| 8,250,921 B2 | 8/2012 | Nasiri et al. | |
| 8,421,168 B2 | 4/2013 | Allen et al. | |
| 2002/0021059 A1 | 2/2002 | Knowles et al. | |
| 2002/0178831 A1 | 12/2002 | Takada | |
| 2003/0061878 A1 | 4/2003 | Pinson | |
| 2003/0200807 A1 | 10/2003 | Hulsing, II | |
| 2004/0119137 A1 | 6/2004 | Leonardi et al. | |
| 2004/0177689 A1 | 9/2004 | Cho | |
| 2004/0211258 A1 | 10/2004 | Geen | |
| 2004/0219340 A1 | 11/2004 | McNeil et al. | |
| 2004/0231420 A1 | 11/2004 | Xie et al. | |
| 2004/0251793 A1 | 12/2004 | Matsuhisa | |
| 2005/0005698 A1 | 1/2005 | McNeil et al. | |
| 2005/0139005 A1 | 6/2005 | Geen | |
| 2005/0189635 A1 | 9/2005 | Humpston et al. | |
| 2006/0032308 A1 | 2/2006 | Acar et al. | |
| 2006/0034472 A1 | 2/2006 | Bazarjani et al. | |
| 2006/0043608 A1 | 3/2006 | Bernier et al. | |
| 2006/0137457 A1 | 6/2006 | Zdeblick | |
| 2006/0213265 A1 | 9/2006 | Weber et al. | |
| 2006/0213266 A1 | 9/2006 | French et al. | |
| 2006/0213268 A1 | 9/2006 | Asami et al. | |
| 2006/0246631 A1* | 11/2006 | Lutz et al. | 438/127 |
| 2007/0013052 A1 | 1/2007 | Zhe et al. | |
| 2007/0040231 A1 | 2/2007 | Harney et al. | |
| 2007/0047744 A1 | 3/2007 | Harney et al. | |
| 2007/0071268 A1 | 3/2007 | Harney et al. | |
| 2007/0085544 A1 | 4/2007 | Viswanathan | |
| 2007/0099327 A1 | 5/2007 | Hartzell et al. | |
| 2007/0114643 A1 | 5/2007 | DCamp et al. | |
| 2007/0165888 A1 | 7/2007 | Weigold | |
| 2007/0205492 A1 | 9/2007 | Wang | |
| 2007/0220973 A1 | 9/2007 | Acar | |
| 2007/0222021 A1 | 9/2007 | Yao | |
| 2007/0284682 A1 | 12/2007 | Laming et al. | |
| 2008/0049230 A1 | 2/2008 | Chin et al. | |
| 2008/0081398 A1 | 4/2008 | Lee et al. | |
| 2008/0083958 A1 | 4/2008 | Wei et al. | |
| 2008/0083960 A1 | 4/2008 | Chen et al. | |
| 2008/0092652 A1 | 4/2008 | Acar | |
| 2008/0122439 A1 | 5/2008 | Burdick et al. | |
| 2008/0157238 A1 | 7/2008 | Hsiao | |
| 2008/0157301 A1 | 7/2008 | Ramakrishna et al. | |
| 2008/0169811 A1 | 7/2008 | Viswanathan | |
| 2008/0202237 A1 | 8/2008 | Hammerschmidt | |
| 2008/0245148 A1 | 10/2008 | Fukumoto | |
| 2008/0247585 A1 | 10/2008 | Leidl et al. | |
| 2008/0251866 A1 | 10/2008 | Belt et al. | |
| 2008/0290756 A1 | 11/2008 | Huang | |
| 2008/0302559 A1 | 12/2008 | Leedy | |
| 2008/0314147 A1 | 12/2008 | Nasiri | |
| 2009/0064780 A1 | 3/2009 | Coronato et al. | |
| 2009/0140606 A1 | 6/2009 | Huang | |
| 2009/0175477 A1 | 7/2009 | Suzuki et al. | |
| 2009/0183570 A1 | 7/2009 | Acar et al. | |
| 2009/0194829 A1 | 8/2009 | Chung et al. | |
| 2009/0263937 A1 | 10/2009 | Ramakrishna et al. | |
| 2009/0266163 A1 | 10/2009 | Ohuchi et al. | |
| 2010/0019393 A1 | 1/2010 | Hsieh et al. | |
| 2010/0024548 A1 | 2/2010 | Cardarelli | |
| 2010/0038733 A1 | 2/2010 | Minervini | |
| 2010/0044853 A1* | 2/2010 | Dekker et al. | 257/692 |
| 2010/0052082 A1 | 3/2010 | Lee | |
| 2010/0072626 A1* | 3/2010 | Theuss et al. | 257/774 |
| 2010/0155863 A1 | 6/2010 | Weekamp | |
| 2010/0206074 A1 | 8/2010 | Yoshida et al. | |
| 2010/0212425 A1 | 8/2010 | Hsu et al. | |
| 2010/0224004 A1 | 9/2010 | Suminto et al. | |
| 2010/0236327 A1 | 9/2010 | Mao et al. | |
| 2011/0030473 A1 | 2/2011 | Acar | |
| 2011/0030474 A1 | 2/2011 | Kuang et al. | |
| 2011/0094302 A1 | 4/2011 | Schofield et al. | |
| 2011/0121413 A1 | 5/2011 | Allen et al. | |
| 2011/0265564 A1 | 11/2011 | Acar et al. | |
| 2013/0139591 A1 | 6/2013 | Acar | |
| 2013/0139592 A1 | 6/2013 | Acar | |
| 2013/0192364 A1 | 8/2013 | Acar | |
| 2013/0192369 A1 | 8/2013 | Acar et al. | |
| 2013/0247666 A1 | 9/2013 | Acar | |
| 2013/0247668 A1 | 9/2013 | Bryzek | |
| 2013/0250532 A1 | 9/2013 | Bryzek et al. | |
| 2013/0257487 A1 | 10/2013 | Opris et al. | |
| 2013/0263641 A1 | 10/2013 | Opris et al. | |
| 2013/0263665 A1 | 10/2013 | Opris et al. | |
| 2013/0265070 A1 | 10/2013 | Kleks et al. | |
| 2013/0265183 A1 | 10/2013 | Kleks et al. | |
| 2013/0268227 A1 | 10/2013 | Opris et al. | |
| 2013/0268228 A1 | 10/2013 | Opris et al. | |
| 2013/0269413 A1 | 10/2013 | Tao et al. | |
| 2013/0270657 A1 | 10/2013 | Acar et al. | |
| 2013/0270660 A1 | 10/2013 | Bryzek et al. | |
| 2013/0271228 A1 | 10/2013 | Tao et al. | |
| 2013/0277772 A1 | 10/2013 | Bryzek et al. | |
| 2013/0277773 A1 | 10/2013 | Bryzek et al. | |
| 2013/0298671 A1 | 11/2013 | Acar et al. | |
| 2013/0328139 A1 | 12/2013 | Acar, Cenk | |
| 2013/0341737 A1 | 12/2013 | Bryzek, Janusz et al. | |

FOREIGN PATENT DOCUMENTS

| | | |
|---|---|---|
| CN | 101858928 A | 10/2010 |
| CN | 102597699 A | 7/2012 |
| CN | 103209922 A | 7/2013 |
| CN | 103210278 A | 7/2013 |
| CN | 103221331 A | 7/2013 |
| CN | 103221332 A | 7/2013 |
| CN | 103221333 A | 7/2013 |
| CN | 103221778 A | 7/2013 |
| CN | 103221779 A | 7/2013 |
| CN | 103221795 A | 7/2013 |
| CN | 103238075 A | 8/2013 |
| CN | 103363969 A | 10/2013 |
| CN | 103363983 A | 10/2013 |
| CN | 103364590 A | 10/2013 |
| CN | 103364593 A | 10/2013 |
| CN | 103368503 A | 10/2013 |
| CN | 103368562 A | 10/2013 |
| CN | 103368577 A | 10/2013 |
| CN | 103376099 A | 10/2013 |
| CN | 103376102 A | 10/2013 |
| CN | 103403495 A | 11/2013 |
| DE | 112011103124 T5 | 12/2013 |
| EP | 1460380 A1 | 9/2004 |

(56) References Cited

FOREIGN PATENT DOCUMENTS

| | | |
|---|---|---|
| EP | 1521086 A1 | 4/2005 |
| EP | 1688705 A2 | 8/2006 |
| EP | 1860402 A1 | 11/2007 |
| EP | 2259019 A1 | 12/2010 |
| JP | 09089927 A | 4/1997 |
| JP | 10239347 A | 9/1998 |
| JP | 2005024310 A | 1/2005 |
| JP | 2005114394 A | 4/2005 |
| JP | 2005294462 A | 10/2005 |
| JP | 2007024864 A | 2/2007 |
| JP | 2008294455 A | 12/2008 |
| JP | 2009075097 A | 4/2009 |
| JP | 2010025898 A | 2/2010 |
| JP | 2010506182 A | 2/2010 |
| KR | 1020110055449 A1 | 5/2011 |
| KR | 1020130052652 A | 5/2013 |
| KR | 1020130052653 A | 5/2013 |
| KR | 1020130054441 A | 5/2013 |
| KR | 1020130055693 A | 5/2013 |
| KR | 1020130057485 A | 5/2013 |
| KR | 1020130060338 A | 6/2013 |
| KR | 1020130061181 A | 6/2013 |
| KR | 101311966 B1 | 9/2013 |
| KR | 1020130097209 A | 9/2013 |
| KR | 101318810 B1 | 10/2013 |
| KR | 102013011618 A | 10/2013 |
| KR | 102013011621 A | 10/2013 |
| KR | 1020130037462 A | 10/2013 |
| KR | 1020130112789 A | 10/2013 |
| KR | 1020130112792 A | 10/2013 |
| KR | 1020130112804 A | 10/2013 |
| KR | 1020130113385 A | 10/2013 |
| KR | 1020130113386 A | 10/2013 |
| KR | 1020130113391 A | 10/2013 |
| KR | 101332701 B1 | 11/2013 |
| KR | 102013013991 A | 12/2013 |
| KR | 102013014211 A | 12/2013 |
| KR | 101352827 B1 | 1/2014 |
| WO | WO-2008059757 A1 | 5/2008 |
| WO | WO2008/087578 A2 * 7/2008 ............ H01L 23/498 |
| WO | WO-2009050578 A2 | 4/2009 |
| WO | WO-2011016859 A2 | 2/2011 |
| WO | WO-2011016859 A3 | 2/2011 |
| WO | WO-2012037492 A2 | 3/2012 |
| WO | WO-2012037492 A3 | 3/2012 |
| WO | WO-2012037501 A2 | 3/2012 |
| WO | WO-2012037501 A3 | 3/2012 |
| WO | WO-2012037536 A2 | 3/2012 |
| WO | WO-2012037537 A2 | 3/2012 |
| WO | WO-2012037538 A2 | 3/2012 |
| WO | WO-2012037539 A1 | 3/2012 |
| WO | WO-2012037539 A9 | 3/2012 |
| WO | WO-2012037540 A2 | 3/2012 |
| WO | WO-2012040194 A1 | 3/2012 |
| WO | WO-2012040211 A2 | 3/2012 |
| WO | WO-2012040245 A2 | 3/2012 |
| WO | WO-2012040245 A3 | 3/2012 |
| WO | WO-2013115967 A1 | 8/2013 |
| WO | WO-2013116356 A1 | 8/2013 |
| WO | WO-2013116514 A1 | 8/2013 |
| WO | WO-2013116522 A1 | 8/2013 |

OTHER PUBLICATIONS

U.S. Appl. No. 13/363,537, filed Feb. 1, 2012, MEMS Proof Mass With Split Z-Axis Portions.

"International Application Serial No. PCT/US2011/052059, International Preliminary Report on Patentability mailed Jan. 22, 2013", 14 pgs.

"International Application Serial No. PCT/US2011/052060, International Preliminary Report on Patentability mailed Jan. 22, 2013", 12 pgs.

"U.S. Appl. No. 12/849,742, Non Final Office Action mailed Mar. 28, 2013", 9 pgs.

"U.S. Appl. No. 12/849,742, Response filed Jan. 23, 2012 to Non Final Office Action mailed Aug. 23, 2012", 10 pgs.

"U.S. Appl. No. 13/813,443, Preliminary Amendment mailed Jan. 31, 2013", 3 pgs.

"U.S. Appl. No. 13/821,586, Preliminary Amendment mailed Mar. 8, 2013", 6 pgs.

"U.S. Appl. No. 13/821,589, Preliminary Amendment mailed Mar. 8, 2013", 6 pgs.

"U.S. Appl. No. 13/821,598, Preliminary Amendment mailed Mar. 8, 2013", 7 pgs.

"U.S. Appl. No. 13/821,609, Preliminary Amendment mailed Mar. 8, 2013", 3 pgs.

"U.S. Appl. No. 13/821,612, Preliminary Amendment mailed Mar. 8, 2013", 3 pgs.

"U.S. Appl. No. 13/821,793, Preliminary Amendment mailed Mar. 8, 2013", 3 pgs.

"U.S. Appl. No. 13/821,842, Preliminary Amendment mailed Mar. 8, 2013", 3 pgs.

"U.S. Appl. No. 13/821,853, Preliminary Amendment mailed Mar. 8, 2013", 3 pgs.

"International Application Serial No. PCT/US2011/051994, International Preliminary Report on Patentability mailed Mar. 28, 2013", 8 pgs.

"International Application Serial No. PCT/US2011/052006, International Preliminary Report on Patentability mailed Mar. 28, 2013", 7 pgs.

"International Application Serial No. PCT/US2011/052061, International Preliminary Report on Patentability mailed Mar. 28, 2013", 6 pgs.

"International Application Serial No. PCT/US2011/052064, International Preliminary Report on Patentability mailed Mar. 28, 2013", 5 pgs.

"International Application Serial No. PCT/US2011/052065, International Preliminary Report on Patentability mailed Mar. 28, 2013", 7 pgs.

"International Application Serial No. PCT/US2011/052369, International Preliminary Report on Patentability mailed Apr. 4, 2013", 5 pgs.

"International Application Serial No. PCT/US2011/052417, International Preliminary Report on Patentability mailed Apr. 4, 2013", 6 pgs.

"International Application Serial No. PCT/US2010/002166, International Search Report mailed Feb. 28, 2011", 3 pgs.

"International Application Serial No. PCT/US2010/002166, Written Opinion mailed Feb. 28, 2011", 4 pgs.

"International Application Serial No. PCT/US2011/052006, Search Report mailed Apr. 16, 2012", 3 pgs.

"International Application Serial No. PCT/US2011/052006, Written Opinion mailed Apr. 16, 2012", 5 pgs.

"International Application Serial No. PCT/US2011/052059, Search Report mailed Apr. 20, 2012", 4 pgs.

"International Application Serial No. PCT/US2011/052059, Written Opinion mailed Apr. 20, 2012", 7 pgs.

"International Application Serial No. PCT/US2011/052060, International Search Report Apr. 20, 2012", 3 pgs.

"International Application Serial No. PCT/US2011/052060, Written Opinion mailed Apr. 20, 2012", 7 pgs.

"International Application Serial No. PCT/US2011/052061, International Search Report mailed Apr. 10, 2012", 3 pgs.

"International Application Serial No. PCT/US2011/052061, Written Opinion mailed Apr. 10, 2012", 4 pgs.

"International Application Serial No. PCT/US2011/052065, International Search Report mailed Apr. 10, 2012", 3 pgs.

"International Application Serial No. PCT/US2011/052065, Written Opinion mailed Apr. 10, 2012", 5 pgs.

"International Application Serial No. PCT/US2011/052369, International Search Report mailed Apr. 24, 2012", 6 pgs.

"International Application Serial No. PCT/US2011/052369, Written Opinion mailed Apr. 24, 2012", 3 pgs.

Cabruja, Enric, et al., "Piezoresistive Accelerometers for MCM-Package-Part II", The Packaging Journal of Microelectromechanical Systems. vol. 14, No. 4, (Aug. 2005), 806-811.

(56) References Cited

OTHER PUBLICATIONS

"U.S. Appl. No. 12/849,742, Response filed Sep. 30, 2013 to Non-Final Office Action mailed Mar. 28, 2013", 12 pgs.
"U.S. Appl. No. 12/947,543, Notice of Allowance mailed Dec. 17, 2012", 11 pgs.
"U.S. Appl. No. 13/821,619, Preliminary Amendment mailed Mar. 8, 2013", 3 pgs.
"Chinese Application Serial No. 201180053926.1, Amendment filed Aug. 21, 2013", w/English Translation, 13 pgs.
"Chinese Application Serial No. 201180055309.5, Voluntary Amendment filed Aug. 23, 2013", w/English Translation, 13 pgs.
"Chinese Application Serial No. 201320165465.3, Office Action mailed Jul. 22, 2013", w/English Translation, 2 pgs.
"Chinese Application Serial No. 201320165465.3, Response filed Aug. 7, 2013 to Office Action mailed Jul. 22, 2013", w/English Translation, 39 pgs.
"Chinese Application Serial No. 201320171504.0, Office Action mailed Jul. 22, 2013", w/English Translation, 3 pgs.
"Chinese Application Serial No. 201320171504.0, Response filed Jul. 25, 2013 to Office Action mailed Jul. 22, 2013", w/English Translation, 33 pgs.
"Chinese Application Serial No. 201320171616.6, Office Action mailed Jul. 10, 2013", w/English Translation, 2 pgs.
"Chinese Application Serial No. 201320171757.8, Office Action mailed Jul. 11, 2013", w/English Translation, 2 pgs.
"Chinese Application Serial No. 201320171757.8, Response filed Jul. 25, 2013 to Office Action mailed Jul. 11, 2013", w/English Translation, 21 pgs.
"Chinese Application Serial No. 201320171757.8, Response filed Jul. 26, 2013 to Office Action mailed Jul. 10, 2013", w/English Translation, 40 pgs.
"Chinese Application Serial No. 201320172128.7, Office Action mailed Jul. 12, 2013", w/English Translation, 3 pgs.
"Chinese Application Serial No. 201320172128.7, Response filed Aug. 7, 2013 to Office Action mailed Jul. 12, 2013", w/English Translation, 39 pgs.
"Chinese Application Serial No. 201320172366.8, Office Action mailed Jul. 9, 2013", w/English Translation, 3 pgs.
"Chinese Application Serial No. 201320172366.8, Response filed Sep. 16, 2013 to Office Action mailed Jul. 9, 2013", w/English Translation, 24 pgs.
"Chinese Application Serial No. 201320172367.2, Office Action mailed Jul. 9, 2013", w/English Translation, 2 pgs.
"Chinese Application Serial No. 201320172367.2, Response filed Sep. 16, 2013 to Office Action mailed Jul. 9, 2013", w/English Translation, 24 pgs.
"Chinese Application Serial No. 201320185461.1, Office Action mailed Jul. 23, 2013", w/English Translation, 3 pgs.
"Chinese Application Serial No. 201320185461.1, Response filed Sep. 10, 2013 to Office Action mailed Jul. 23, 2013", w/English Translation, 25 pgs.
"Chinese Application Serial No. 201320186292.3, Office Action mailed Jul. 19, 2013", w/English Translation, 2 pgs.
"Chinese Application Serial No. 201320186292.3, Response filed Sep. 10, 2013 to Office Action mailed Jul. 19, 2013", w/English Translation, 23 pgs.
"DigiSiMic™ Digital Silicon Microphone Pulse Part Number: TC100E", TC100E Datasheet version 4.2 DigiSiMic™ Digital Silicon Microphone. (Jan. 2009), 6 pgs.
"EPCOS MEMS Microphone With TSV", (2005), 1 pg.
"European Application Serial No. 13001692.6, European Search Report mailed Jul. 24, 2013", 5 pgs.
"European Application Serial No. 13001696.7, Extended European Search Report mailed Aug. 6, 2013", 4 pgs.
"European Application Serial No. 13001721.3, European Search Report mailed Jul. 18, 2013", 9 pgs.
"International Application Serial No. PCT/US2011/052340, International Preliminary Report on Patentability mailed Apr. 4, 2013", 5 pgs.

"International Application Serial No. PCT/US2011/052340, Search Report mailed Feb. 29, 2012", 3 pgs.
"International Application Serial No. PCT/US2011/052340, Written Opinion mailed Feb. 29, 2012", 3 pgs.
"International Application Serial No. PCT/US2013/021411, International Search Report mailed Apr. 30, 2013", 5 pgs.
"International Application Serial No. PCT/US2013/021411, Written Opinion mailed Apr. 30, 2013", 5 pgs.
"International Application Serial No. PCT/US2013/023877, International Search Report mailed May 14, 2013", 3 pgs.
"International Application Serial No. PCT/US2013/023877, Written Opinion mailed May 14, 2013", 5 pgs.
"International Application Serial No. PCT/US2013/024138, International Search Report mailed May 24, 2013", 3 pgs.
"International Application Serial No. PCT/US2013/024138, Written Opinion mailed May 24, 2013", 4 pgs.
"International Application Serial No. PCT/US2013/024149, Written Opinion mailed", 4 pages, mailed May 15, 2013.
"International Application Serial No. PCT/US2013/024149, International Search Report mailed", 7 pages, mailed May 15, 2013.
"Korean Application Serial No. 10-2013-7009775, Office Action mailed Sep. 17, 2013", w/English Translation, 6 pgs.
"Korean Application Serial No. 10-2013-7009777, Office Action mailed Sep. 17, 2013", w/English Translation, 8 pgs.
"Korean Application Serial No. 10-2013-7009788, Office Action mailed Aug. 29, 2013", w/English Translation, 6 pgs.
"Korean Application Serial No. 10-2013-7009790, Office Action mailed Jun. 26, 2013", W/English Translation, 7 pgs.
"Korean Application Serial No. 10-2013-7009790, Response filed Aug. 26, 2013 to Office Action mailed Jun. 26, 2013", w/English Claims, 11 pgs.
"Korean Application Serial No. 10-2013-7010143, Office Action mailed May 28, 2013", w/English Translation, 5 pgs.
"Korean Application Serial No. 10-2013-7010143, Response filed Jul. 24, 2013 to Office Action mailed May 28, 2013", w/English Claims, 14 pgs.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, 187-206, (2009).
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.
Ferreira, Antoine, et al., "A Survey of Modeling and Control Techniques for Micro- and Nanoelectromechanical Systems", IEEE Transactions on Systems, Man and Cybernetics—Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.
Krishnamurthy, Rajesh, et al., "Drilling and Filling, but not in your Dentist's Chair A look at some recent history of multi-chip and through silicon via (TSV) technology", Chip Design Magazine, (Oct./Nov. 2008), 7 pgs.
Reljin, Branimir D, "Properties of SAB filters with the two-pole single-zero compensated operational amplifier", Circuit Theory and Applications: Letters to the Editor. vol. 10, (1982), 277-297.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet:

(56) References Cited

OTHER PUBLICATIONS

<URL: http://dspace.mit.edu/bitstream/handle/1721.1/16682/57138272.pdf?...>, (Jan. 1, 2004), 123 pgs.
"Chinese Application Serial No. 201180053926.1, Office Action mailed Jan. 13, 2014", 7 pgs.
"Chinese Application Serial No. 201180054796.3, Office Action mailed Jan. 16, 2014", 8 pgs.
"Chinese Application Serial No. 201180055029.4, Office Action mailed Jan. 13, 2014", 7 pgs.
"Chinese Application Serial No. 201320172366.8, Response filed Dec. 14, 2013 to Office Action mailed Oct. 25, 2013", 11 pgs.
"Chinese Application Serial No. 201320565239.4, Office Action mailed Jan. 16, 2014", w/English Translation, 3 pgs.
"European Application Serial No. 10806751.3, Extended European Search Report mailed Jan. 7, 2014", 7 pgs.
"Korean Application Serial No. 10-2013-0109990, Amendment filed Dec. 10, 2013", 4 pgs.
"Korean Application Serial No. 10-2013-7009775, Office Action mailed Dec. 27, 2013", 8 pgs.
"Korean Application Serial No. 10-2013-7009777, Office Action mailed Jan. 27, 2014", 5 pgs.
"Korean Application Serial No. 10-2013-7009788, Office Action mailed Dec. 27, 2013", w/English Translation, 10 pgs.
"U.S. Appl. No. 12/849,742, Non Final Office Action mailed Aug. 23, 2012", 9 pgs.
"Application Serial No. PCT/US2011/051994, International Republished Application mailed Jun. 7, 2012", 1 pg.
"Application Serial No. PCT/US2011/052006, International Republished Application mailed Jun. 7, 2012", 1 pg.
"Application Serial No. PCT/US2011/052417, International Republished Application mailed Jun. 7, 2012", 1 pg.
"International Application Serial No. PCT/US2010/002166, International Preliminary Report on Patentability mailed Feb. 16, 2012", 6 pgs.
"International Application Serial No. PCT/US2011/051994, International Search Report mailed Apr. 16, 2012", 3 pgs.
"International Application Serial No. PCT/US2011/051994, Written Opinion mailed Apr. 16, 2012", 6 pgs.
"International Application Serial No. PCT/US2011/052064, Search Report mailed Feb. 29, 2012", 3 pgs.
"International Application Serial No. PCT/US2011/052064, Written Opinion mailed Feb. 29, 2012", 3 pgs.
"International Application Serial No. PCT/US2011/052417, International Search Report mailed Apr. 23, 2012", 5 pgs.
"International Application Serial No. PCT/US2011/052417, Written Opinion mailed Apr. 23, 2012", 4 pgs.
Beyne, E, et al., "Through-silicon via and die stacking technologies for microsystems-integration", IEEE International Electron Devices Meeting, (Dec. 2008), 1-4.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.
Rimskog, Magnus, "Through Wafer Via Technology for MEMS and 3D Integration", 32nd IEEE/CPMT International Electronic Manufacturing Technology Symposium, 2007. IEMT '07., (2007), 286-289.
"U.S. Appl. No. 13/362,955, Response filed Feb. 17, 2014 to Restriction Requirement mailed Dec. 17, 2013", 9 pgs.
"U.S. Appl. No. 13/362,955, Restriction Requirement mailed Dec. 17, 2013", 6 pgs.
"U.S. Appl. No. 13/363,537, Non Final Office Action mailed Feb. 6, 2014", 10 pgs.
"U.S. Appl. No. 13/742,942, Notice of Allowance mailed Jan. 28, 2014", 9 pgs.
"U.S. Appl. No. 13/746,016, Notice of Allowance mailed Jan. 17, 2014", 10 pgs.
"U.S. Appl. No. 13/755,841, Restriction Requirement mailed Feb. 21, 2014", 6 pgs.
"U.S. Appl. No. 12/849,742, Notice of Allowance mailed Nov. 29, 2013", 7 pgs.
"Chinese Application Serial No. 201320172366.8, Office Action mailed Oct. 25, 2013", 8 pgs.
"German Application Serial No. 102013014881.2, Office Action mailed Nov. 20, 2013", 1 pg.

* cited by examiner

MICROMACHINED DEVICES AND FABRICATING THE SAME

CROSS REFERENCE TO RELATED APPLICATIONS

This application claims the benefit of U.S. Provisional Application Nos. 61/273,538, entitled "Performance enhancements and fabrication method of micromachined integrated 6-axis inertial measurement device," filed on Aug. 4, 2009, and 61/273,494, entitled "Micromachined inertial sensor devices and methods for making same," filed on Aug. 4, 2009, which are hereby incorporated herein by reference in their entirety.

BACKGROUND OF THE INVENTION

The present invention generally relates to inertial sensor devices and, more particularly, to micromachined inertial sensor devices and methods for making the devices.

With the rapid advance of modern electronic technology, various electronic devices, such as navigation systems, cell phones, and electronic games, require sensors that can accurately determine motions of the devices at low cost with small form factor. Conventional techniques have been developed to bump micro-electro-mechanical-systems (MEMS) chips on ASIC wafers or integrate MEMS with ASIC wafers. However, majority of the existing MEMS sensors measure either acceleration or rotation, but not the 6 degrees-of-freedom (three independent accelerations and three independent rotations) of an object. As such, the existing ASIC wafers for detecting the motion of an object in 6 DOF have large form factors to accommodate multiple MEMS sensors and extra circuits or algorithms to handle the data received from the multiple sensors. Furthermore, fabrication of multiple MEMS and packaging/integration of MEMS with ASIC wafers increase the manufacturing cost of the sensor devices. Thus, there is a need for a single MEMS device that can detect the motion of an object in 6 DOF so that the overall form factor and manufacturing cost of a sensor device that contains the MEMS can be significantly reduced.

SUMMARY OF THE INVENTION

In one embodiment of the present invention, a method for fabricating a device includes: providing a first wafer having at least one via; bonding a second wafer having a substantially uniform thickness to the first wafer; and etching the bonded second wafer to form a micro-electromechanical-systems (MEMS) layer.

In another embodiment of the present invention, a device includes: a first wafer having at least one via; and a second wafer having a micro-electromechanical-systems (MEMS) layer and bonded to the first wafer. The via forms a closed loop when viewed in a direction normal to a top surface of the first wafer to thereby define an island electrically isolated.

These and other features, aspects and advantages of the present invention will become better understood with reference to the following drawings, description, and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention because the scope of the invention is best defined by the appended claims.

Figure 1A:
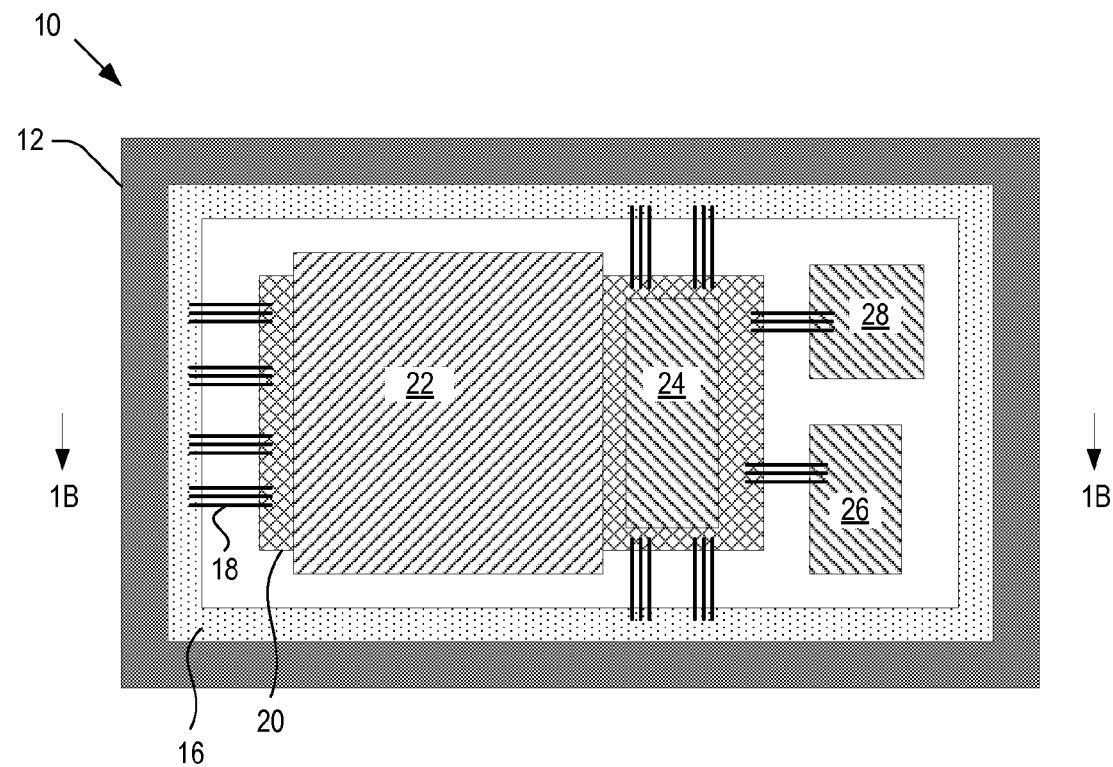
FIG. 1A shows a schematic top view of a Global positioning System (GPS) having a multi-DOF device in accordance with an embodiment of the present invention.

FIG. 1A shows a top view of a Global Positioning System (GPS) 10 having a multi-DOF device (or sensor unit) 22, where a lid 14 (shown in FIG. 1B) is taken off to reveal the inner structure of the GPS 10. (Hereinafter, the GPS is used as an exemplary application having the multi-DOF device 22.

However, it should be apparent to those of ordinary skill in the art that the multi-DOF device may be applied to various types of electronic devices.) As depicted, the multi-DOF device 22 is bumped on an ASIC wafer 20 via bumps 30, where the ASIC wafer communicates signals with a suitable device located outside the GPS 10 via wires 18 and contacts/vias 16. As an alternative, the multi-DOF device 22 may be wire-bonded to ASIC wafer 20.

The GPS 10 may include other sensors, such as pressure sensor 24, Z magnetic sensor 26, and XY magnetic sensor 28. The pressure sensor 24 may be connected to the ASIC wafer 20 via bumps 30. The XY magnetic sensor 28 and Z magnetic sensor 26 may be wire-bonded to the ACIS wafer 20. As an alternative, the XY-magnetic sensor 28 and Z magnetic sensor 26 may be bumped on the ASIC wafer 20. A housing 12 and the lid 14 enclose the components of the GPS 10. The ASIC wafer 20 and the magnetic sensors 26, 28 may be secured to the housing 12 via a suitable attaching material, such as glue.

Figure 1B:
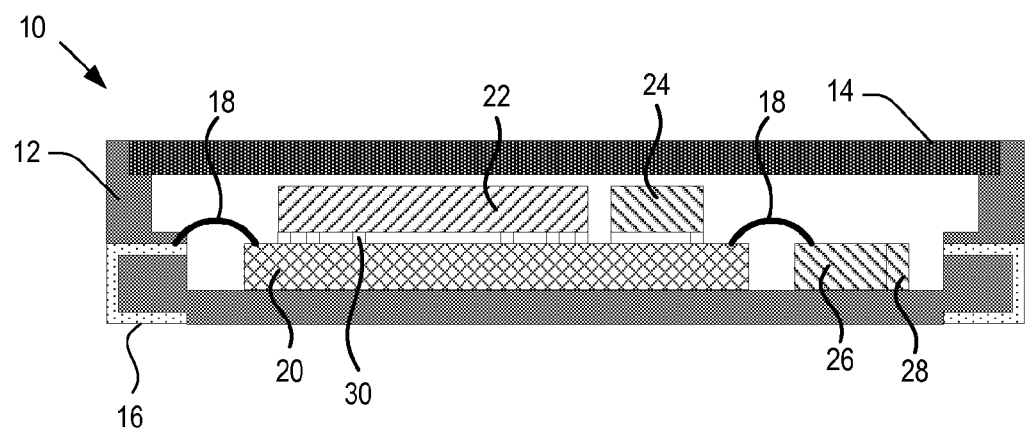
FIG. 1B shows a schematic cross sectional view of the Global positioning System (GPS) taken along the line 1B-1B.
Figure 10:
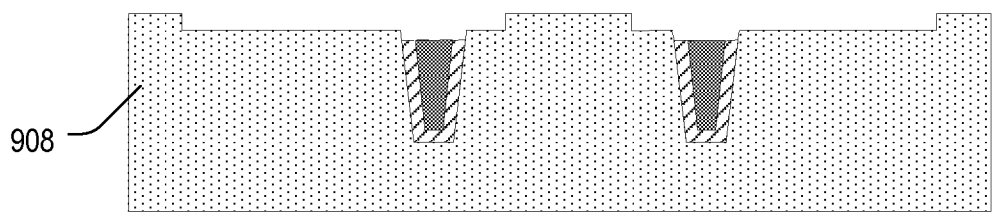
FIG. 10 shows the via/cap wafer of FIG. 9 fabricated by the process described in conjunction with FIGS. 2D-2J.

FIG. 10 shows an enlarged view of the multi-DOF device 22 of FIG. 1B. As depicted, the multi-DOF device 22 includes a cap wafer 102; a device layer (or, equivalently, MEMS layer) 106 that includes MEMS structures; and a via wafer 108. The cap wafer 102 may be metal bonded to the device layer 106 along the perimeter of the device layer, where the metal bonding 104 can generate thermal stress between the cap wafer 102 and the device layer 106 during operation. To isolate the device layer 106 from the thermal stress, a stress reducing groove 120 may be optionally formed around the perimeter of the device layer 106. The metal bond 104 may be a non-high temperature fusion bond and enable the application of getter to maintain a long term vacuum and application of an anti-stiction coating to prevent stiction that could occur to low-g acceleration sensors. The via wafer 108 may be fusion bonded, such as silicon-silicon fusion bonded, to the device layer 106 along the perimeter of the device layer 106, obviating thermal stress between the via wafer 108 and the device layer 106.

In another embodiment, a fusion bond, such as silicon-silicon fusion bond, may be used in place of the metal bond 104. In still another embodiment, the device layer 106 may be metal bonded to the via wafer 108.

The via wafer 108 may include a protruding portion (or, equivalently, anchor) 103 that provides an anchoring (attaching) structure for the device layer 106. The anchor 103 may be located near the center of the via device layer 106. The anchor 103 may be fusion bonded to the device layer 106, to thereby eliminate potential problems associated with metal fatigue.

Sensors formed in the device layer 106 measure small changes in capacitance to detect angular displacements. As such, any external electric or magnetic field may affect the accuracy in the measurement of the angular displacements. To shield the external electric and magnetic fields, the device layer 106 and the cap wafer 102 are electrically connected to each other and preferably grounded.

The via wafer 108 includes multiple regions separated by isolating trenches (or, equivalently, vias) 114. The core 118 of each via 114 is filled with conductive non-crystalline material, such as polysilicon or metal. The core 118 is electrically insulated by dielectric material 116, and can be electrically biased to the voltage at the electrode, to create a zero voltage differential and thereby to eliminate the shunt capacitance of the via.

Each of the regions separated by the isolating trenches 114 has an electrical contact for data communication. For example, as depicted in FIG. 10, the via wafer 108 may include three contacts 110, 111, and 112 that may be connected to an ASIC wafer by bumps or wire-bonds. In another example, the contact 110 may be an electrode contact that is connected to the via 114, while the contact 111 may be an anchor contact electrically connected to the anchor 103, and the contact 112 is a circular via contact electrically connected to the via 114.

The device layer 106 may include MEMS structures that function as gyroscopes and acceleration sensors. Electrical connections to the MEMS structure is achieved through anchors and by capacitive coupling between isolated regions of the via wafer 108 and the device layer 106. Detailed description of the MEMS structure and its operation is disclosed in a copending U.S. patent application Ser. No. 12/849,742, entitled "Micromachined inertial sensor devices," filed on Aug. 3, 2010, which is hereby incorporate herein by reference in its entirety.

The dimension of the cap wafer 102, the device layer 106, and the via wafer 108 may vary according to the application of the multi-DOF device 22. For example, the thicknesses of the cap wafer 102, the device layer 106, and via wafer 108 may be 350 µm, 60 µm, and 150 µm, respectively. Gaps on both top and bottom sides of the device layer 106 may be 2 µm, for instance. The metal bond 104 and the fusion bond (not shown in FIG. 10) between the device layer 106 and the via wafer 108 may have a ring shape, and the width of the ring can be 75 µm to ensure hermetic sealing and structural strength. The width of the anchor 103 may be 5 µm.

The multi-DOF device 22 may also include anti-stiction coating to reduce potential problems for acceleration sensors. In one embodiment, the gyros of the device layer 106 may require a high vacuum packaging to deliver a high Q factor. Also, the acceleration sensors of the device layer 106 may need relatively high vacuum to enable operation near critical damping for fast settling. Thus, during the sealing process (or, equivalently, during the bonding process of the device layer 106 to the cap wafer 102 and the via wafer 108), a getter material may be used to ensure vacuum level inside the device 22 below 2 mTorr over 5 years. In another embodiment, the device layer 106 may include an accelerometer that requires a certain level of gas pressure inside the cavity formed by the cap wafer 102 and the via wafer 108, where the gas pressure may be different from the atmospheric pressure. In such a case, the sealing should be able to maintain the pressure difference during the life expectancy of the device 22.

Figure 2A:
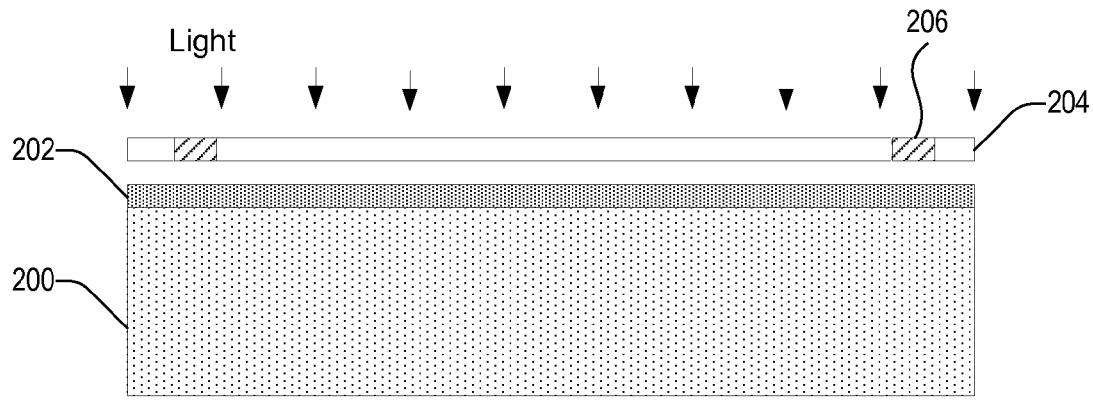
FIGS. 2A-2J show a process for fabricating a via wafer of FIG. 1C in accordance with another embodiment of the present invention.

FIGS. 2A-2J show a process for fabricating the via wafer 108 of FIG. 10. As shown in FIG. 2A, the process starts with a flat double-side-polished (DSP) wafer 200 having a predetermined thickness, preferably 725 µm. The wafer 200 may be made of P-type dopant silicon and its resistivity is equal to or less than 0.02 ohm-cm. To make one or more etch marker masks 210 (shown in FIG. 2C), a suitable etching technique using a photoresist layer may be applied. For instance, a photoresist layer 202 may be applied on the surface of the wafer 200. Then, UV light passing through a mask 204 may be applied to the photoresist layer 202, to thereby make a pattern on the photoresist layer 202. Then, the soft portions 208 where the UV light was blocked by the mask may be washed away to expose the surface of the DSP wafer 200 according to the pattern layout of the mask 204. Then, by a suitable etching technique, such as deep-reactive-ion-etching (DRIE) or reactive-ion-etching (RIE) technique, the DSP wafer 200 may be etched to generate the etch marker masks 210. The etch marker masks 210 may be used to align the via wafer 108 to internal patterns after bonding and need to be etched deep enough to be visible after processing.

Figure 2B:
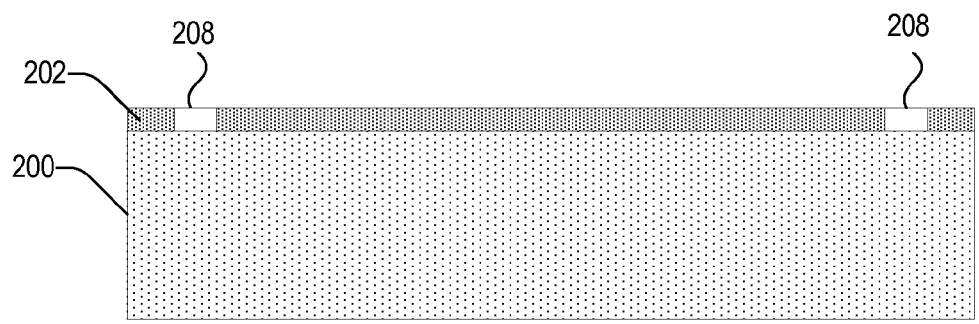
Figure 2C:
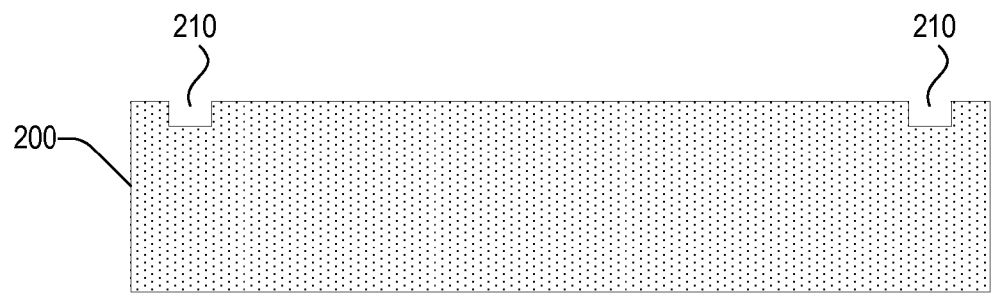
Figure 2D:
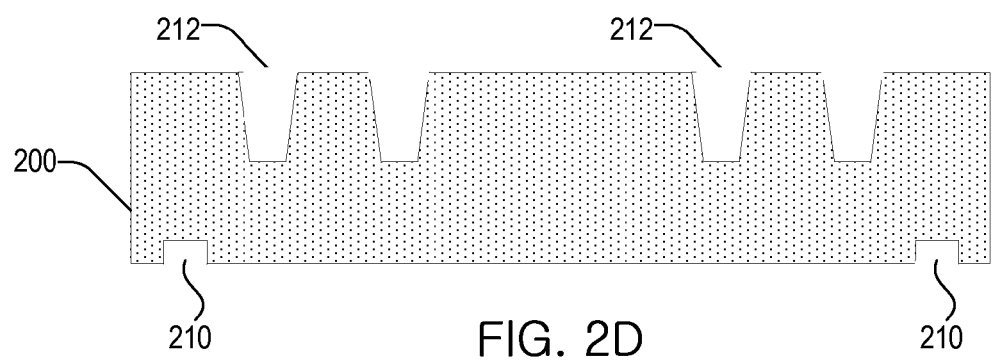

Via openings 212 of FIG. 2D may be etched by the similar process described in conjunction with FIGS. 2A-2C. For instance, the deep-reactive-ion-etching (DRIE) technique with a patterned photoresist layer may be used to etch the via openings 212. The depth of each via opening 212 may be 150 µm and the width may be 10 µm, for instance. The slope of the side wall of each opening 212 is about 80-85 degrees, which is necessary for no seams or keyholes in polyfill.

Figure 2E:
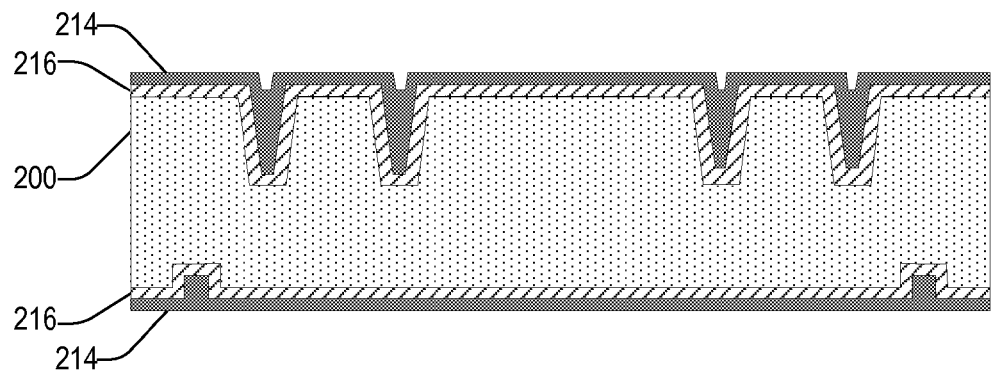

Upon making the masks 210 and the via openings 212, the entire surface of the wafer 200 is oxidized to grow a 1-µm thick thermal oxide layer 216, as shown in FIG. 2E. The oxide layer 216 would form oxide liners 116 for the vias 114 (FIG. 10). It should be apparent to those of ordinary skill in the art that the layer 216 may be formed of any other suitable dielectric material that can electrically insulate the core portions of the vias 114.

As depicted in FIG. 2E, a conformal polysilicon layer 214 is deposited over the oxide layer 216. The polysilicon may be low stress polysilicon deposited at the temperature of 585-600° C.

Figure 1C:
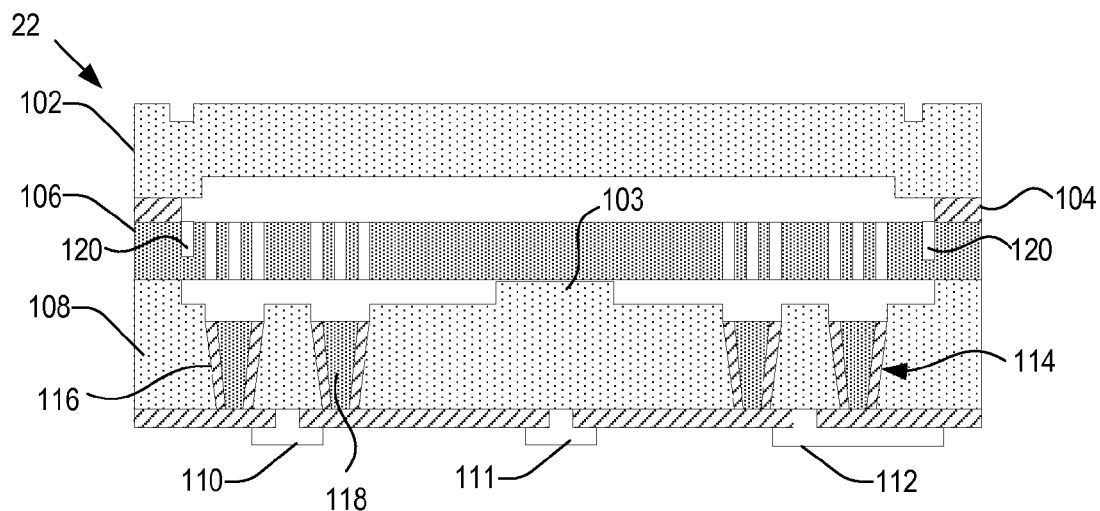
FIG. 1C shows an enlarged cross sectional view of the multi-DOF device of FIG. 1B.
Figure 2F:
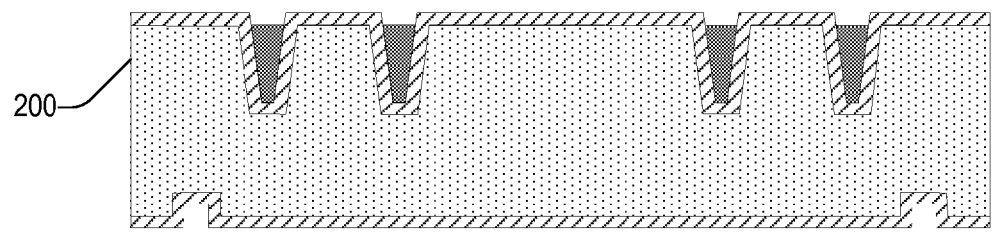
Figure 2G:
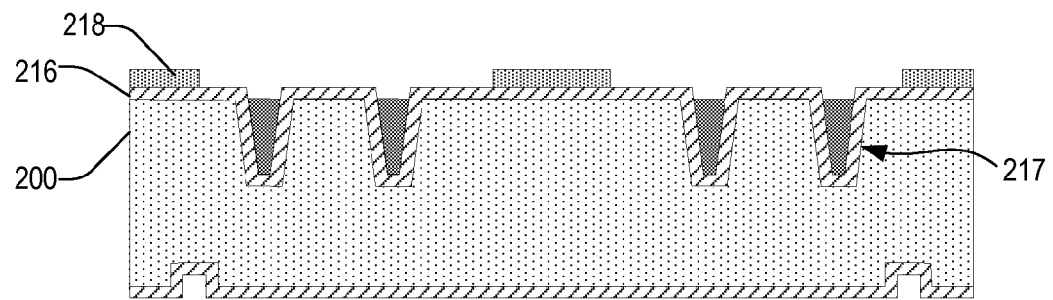
Figure 2H:
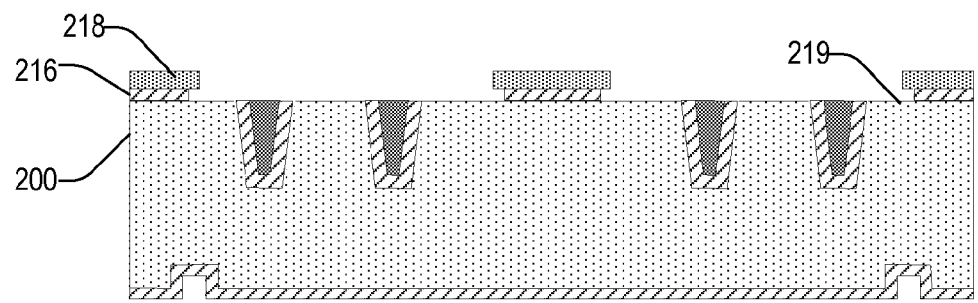
Figure 2I:
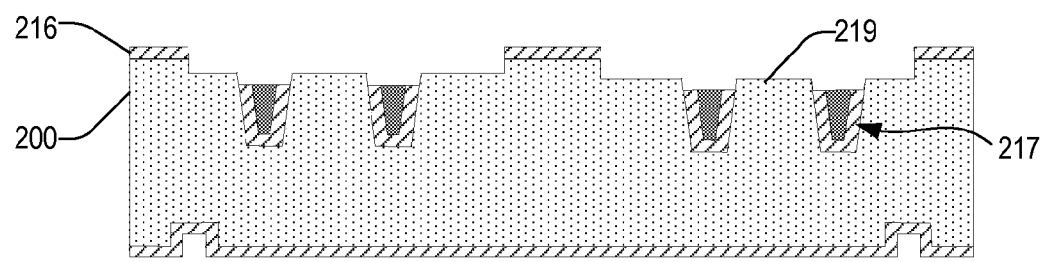

As depicted in FIG. 2F, portions of the polysilicon layer 214 on the top surface of the wafer 200 may be etched by a suitable etching technique, such as chemical-mechanical-polishing (CMP), standard RIE using plasma (SF6), or DRIE. The polysilicon layer 214 deposited on the lower surface of the wafer 200 may cause stress in the wafer 200, and thus is entirely removed to expose the oxide layer 216 deposited over the mask 210, FIG. 2G shows a photoresist layer 218 deposited on the top surface of the oxide layer 216, where the photoresist layer 218 may be patterned by the technique described in conjunction with FIGS. 2A-2B. It is noted that the edges of each via 217 are located away from the actual via structure to eliminate the risk of stacking faults that can be generated on the bond surface 219 (shown in FIG. 2H). Then, as depicted in FIGS. 2H-2I, portions of the oxide layer 216 are etched by a suitable etching technique, such as DRIE or standard RIE using SF6, that uses the patterned photoresist layer 218 as a mask. It is noted that the polysilicon of the via 217 is etched so that it is recessed below the bond surface 219, as depicted in FIG. 2I. It is noted that the top surface of the via wafer 200 is etched to form a cavity. Optionally, the cavity may be formed on the bottom surface of the device layer 106 (shown in FIG. 1) so that portions of the bottom surface of the device layer 106 is spaced apart from the top surface of the via wafer 108.

Figure 2J:
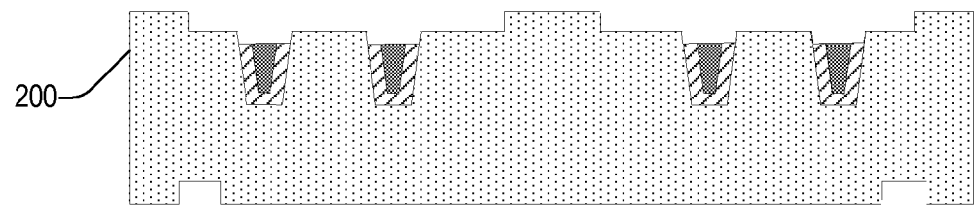

After etching the oxide layer 216, the remaining photoresist layer 218 may be stripped off of the top surface of the wafer 200, as shown in FIG. 2I. As a final step, portions of the oxide layer 216 remaining on the top and bottom surfaces of the wafer 200 may be removed by the buffered-oxide-etching (BOE) technique, as depicted in FIG. 2J.

Figure 3A:
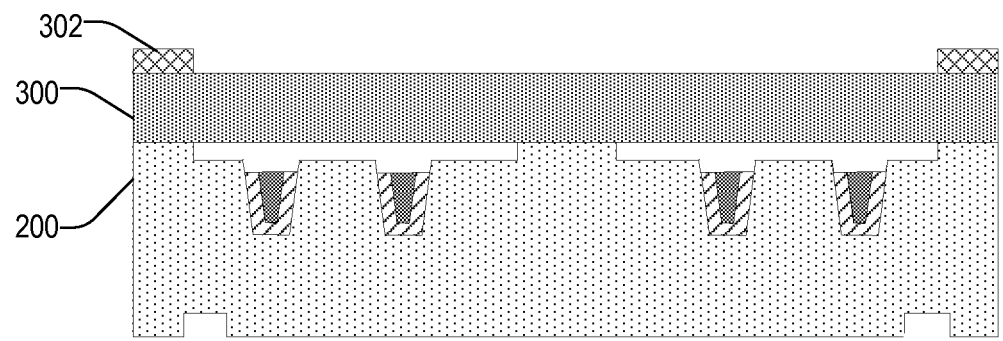
FIGS. 3A-3B show a process for fabricating a device layer of FIG. 1C in accordance with another embodiment of the present invention.
Figure 3B:
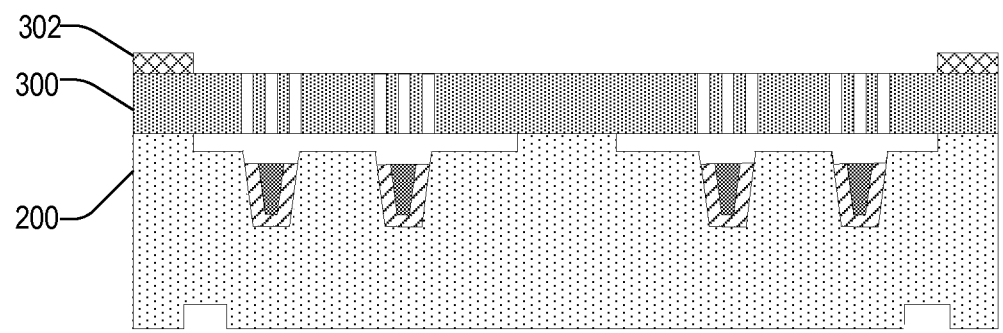

FIGS. 3A-3B show a process for fabricating the device layer 106 of FIG. 10 in accordance with another embodiment of the present invention. As depicted in FIG. 3A, a standard silicon wafer 300 is fusion bonded (such as silicon-silicon fusion bond) to the via wafer 200. Then, the silicon wafer 300 may be ground to the thickness of 60 µm and polished by CMP technique. It is noted that a silicon-on-insulator (SOI) vendor could supply a wafer 300 that is processed to this stage. Then, a bond metal layer 302 may be deposited and patterned on the wafer 300. Note that the bond metal layer 302 is needed if the bond 104 between the cap wafer 102 (shown in FIG. 10) and the device layer 106 (shown in FIG. 10) requires metal layers on both sides of the bond 104.

The silicon wafer 300 may be patterned and etched to form MEMS structures, as shown in FIG. 3B. The steps described in conjunction with FIGS. 2A-2C could be used to pattern and etch the silicon wafer 300. For instance, a photoresist layer may be deposited and patterned to cover the metal layer 302 and a suitable etching technique can be used to pattern the silicon wafer 300. Then, the photoresist layer may be stripped off of the silicon wafer 300. It may be needed to clean the silicon wafer 300 with N-Methyl Pyrrolidone (NMP) stripper to remove etch residues (outgassing) and to verify that all of the chemicals remaining in the cavities are removed. If necessary, the patterned silicon wafer 300 may be cleaned by the $CO_2$ snow cleaning technique or critical point dry (CPD) technique to remove the chemicals remaining in the device layer 300.

As disclosed in the previously cited application Ser. No. 12/849,742, the etched silicon wafer (or, micro-electromechanical-system layer) 300 may include micromachined integrated 6-axis inertial measurement device that can measure angular rates about three axes and accelerations about three axes simultaneously.

Figure 4A:
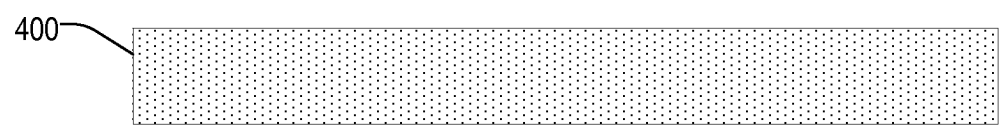
FIGS. 4A-4B show a process for fabricating a cap wafer of FIG. 1C in accordance with another embodiment of the present invention.
Figure 4B:

FIGS. 4A-4B show a process for fabricating the cap wafer 102 of FIG. 10 in accordance with another embodiment of the present invention. As depicted in FIG. 4A, a DSP wafer 400 is prepared, where the wafer may be a standard wafer having a thickness of 725 µm, for instance. Then, using a suitable etching technique, such as DRIE or RIE using a photoresist layer, a cap recess 402 having a predetermined depth, preferably 1-2 µm, is formed. Next, as depicted in FIG. 4B, a bond metal layer 406 may be deposited and patterned on the wafer 400 using a suitable etching technique, such as RIE or DRIE with a photoresist layer. Note that the bond metal layer 406 is needed if the bond 104 between the cap wafer 102 (shown in FIG. 10) and the device layer 106 (shown in FIG. 10) requires metal layers on both sides of the bond. The metal bond 104 between the device layer 106 and the cap wafer 102 may include Au—Si, Cu—Cu, Au—Sn solder or other suitable materials for hermetic bonding.

Figure 5:
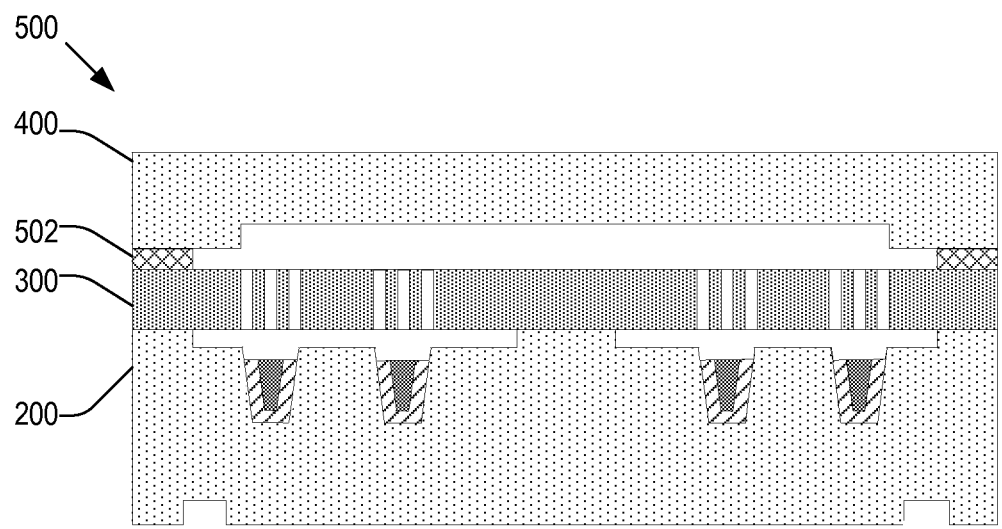
FIG. 5 shows a sensor unit that includes a cap wafer bonded to the device layer and the via wafer fabricated by the processes depicted in FIGS. 2A-3B.

FIG. 5 shows a sensor unit 500 that includes the cap wafer 400 bonded to the device layer 300 and the via wafer 200 fabricated by the processes depicted in FIGS. 2A-3B. As discussed above, the bond 502 (which is the same as the bond 104 in FIG. 10) may be a metal bond. To pattern the bond 502, a suitable etching technique, such as DRIE or RIE using a photoresist layer, may be used. The bond 502 may include Au—Si, Cu—Cu, Au—Sn solder or other suitable materials for hermetic bonding. If needed, a trench (not shown in FIG. 5) may be used to constrain the bond metal, where the trench may be etched by DRIE technique on one or more of the three layers 200, 300, and 400 to contain the eutectic flow.

Figure 6:
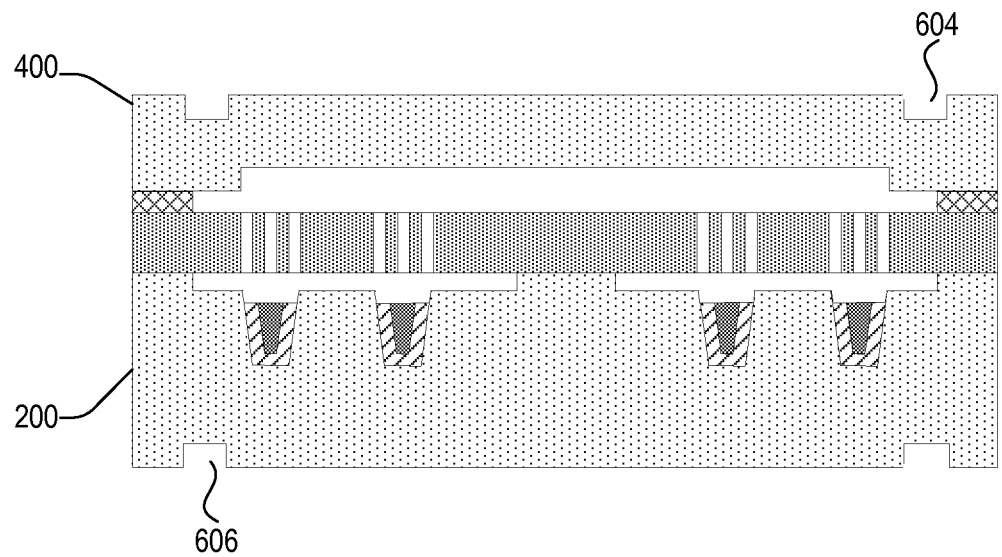
FIG. 6 shows the sensor unit of FIG. 5, where the cap wafer is processed to have a new thickness and a marker.

The cap wafer 400 may be ground to a predetermined thickness, preferably 350 µm and polished. Then, as shown in FIG. 6, the markers 606 formed on the via wafer 200 are transferred to the cap wafer 400 so that new markers 604 are formed in the cap wafer 400. The transfer may be performed by a suitable etching technique, such as DRIE or RIE using a photoresist layer. (In the present document, an etching technique using a photoresist layer refers to the process similar to that described in conjunction with FIGS. 2A-2C.)

Figure 7:
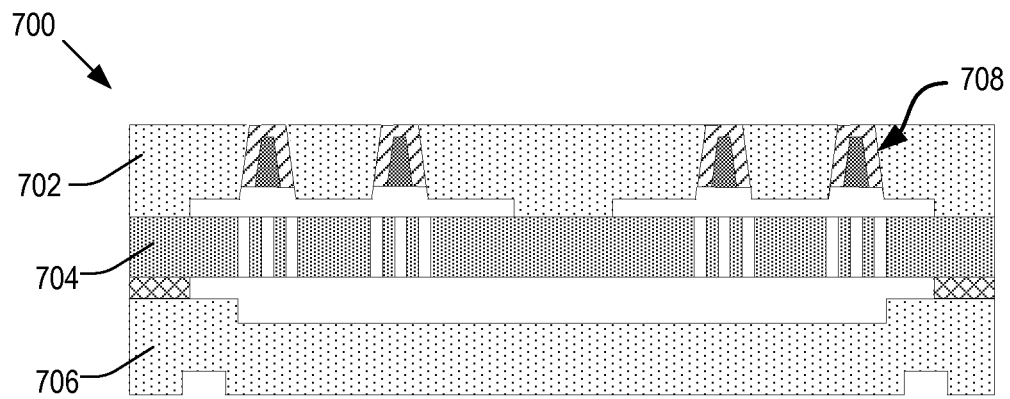
FIG. 7 shows the sensor unit of FIG. 6, where the via wafer is processed to have a new thickness.

FIG. 7 shows a sensor unit 700, where the via wafer 702 of the unit 700 is generated by grinding the via wafer 202 of FIG. 6. As depicted in FIG. 7, the bottom side (or, equivalently, the via side) of the via wafer 202 of FIG. 6 is ground to the thickness of 150 µm and polished so that the vias 708 may be exposed. The device layer 704 and the cap wafer 706 may have thicknesses of 60 µm and 350 µm, respectively.

Figure 8A:
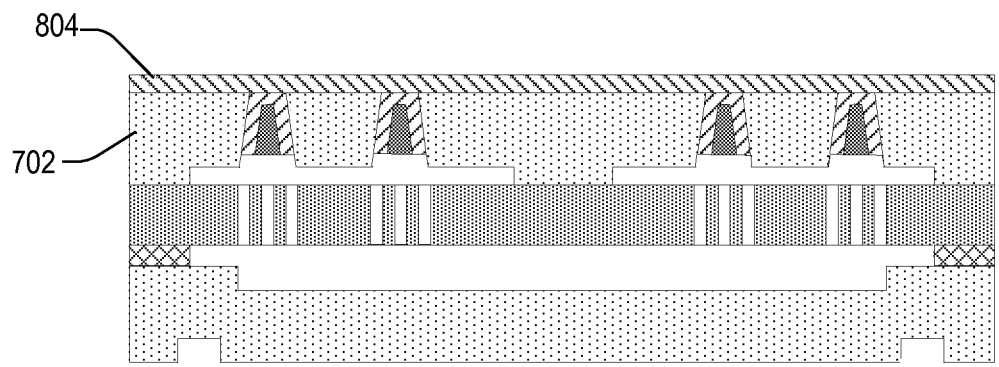
FIGS. 8A-8C show the process for making contacts on the via wafer of FIG. 7.
Figure 8B:
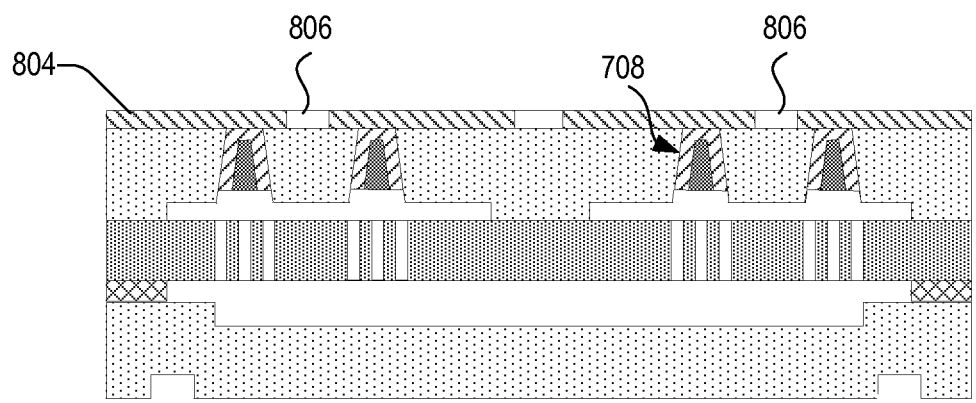
Figure 8C:
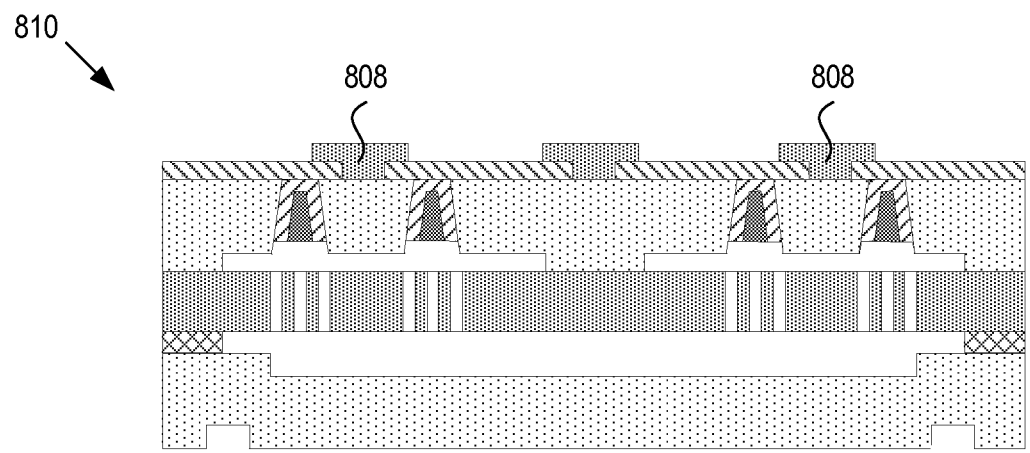

FIGS. 8A-8C show a process for making contacts on the via wafer 702 in accordance with another embodiment of the present invention. As depicted in FIG. 8A, a dielectric film 804 may be deposited on the top surface of the via wafer 702. The dielectric film may be a Plasma Enhanced Chemical Vapor Deposition (PECVD) film, Benzocyclobutene (BCB)

film or any other suitable dielectric film. Then, as depicted in FIG. 8B, the dielectric film 804 is patterned and etched by a suitable etching technique so that one or more contact openings 806 are formed in the areas isolated by vias 708. Next, as depicted in FIG. 8C, contacts 808 (or, equivalently, metal pads/traces) may be deposited and patterned by a suitable etching technique. For instance, a metal layer may be deposited and patterned by DRIE or RIE technique using a photoresist layer. The contacts 808 may be formed of under-bump metal so that the contacts 808 may be soldered to bumps 30 (in FIG. 1B). Since the bumps 30 are located on the edge of the ASCI wafer 20 to reduce stress on the electrodes of the ASIC wafer 20, the contacts 808 corresponding to the bumps are also located on the edge of the via wafer 702. The sensor unit 810 in FIG. 8C is one exemplary embodiment of the multi-DOF device 22, where the sensor unit 810 is mounted on the ASIC wafer 20 by bumps 30.

Figure 9:
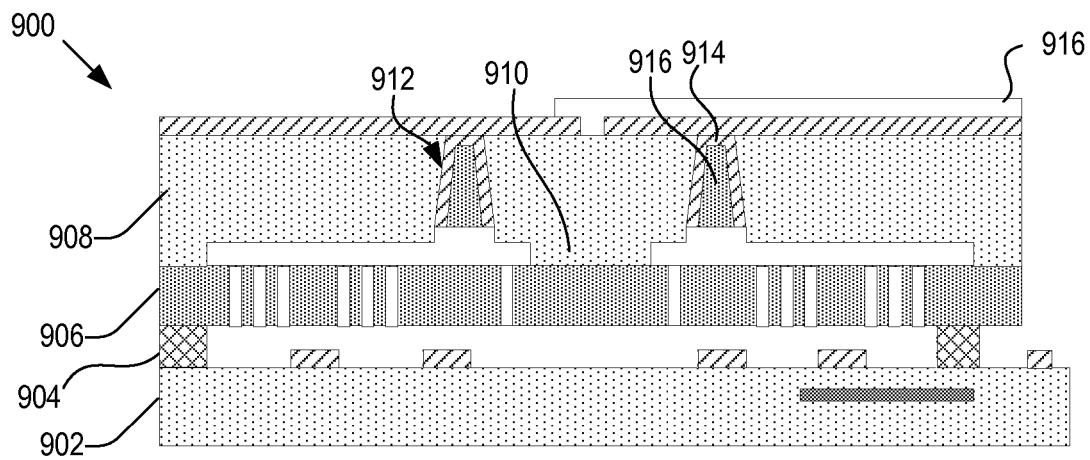
FIG. 9 shows a schematic diagram of a sensor unit, where the sensor unit includes a MEMS layer directly bonded to an ASIC wafer in accordance with another embodiment of the present invention.

FIG. 9 shows a schematic diagram of a sensor unit 900, where a multi-DOF device layer (or, equivalently, a MEMS layer) 906 is directly bonded to an ASIC wafer 902 in accordance with another embodiment of the present invention. As depicted, the device layer 906, which includes MEMS structures, is bonded to the ASIC wafer 902 by a wafer bond 904, where the wafer bond 904 is a low temperature bond, such as metal bond, and may have a ring shape. The metal used for the bond 904 may be reused to form sensor and driver electrodes of the ASIC wafer 902. To enable grounding of the device layer 906, the bond 904 is electrically conductive and able to stand the thermal compression during operation. The ASIC wafer 902 may include integrated electronics and multi-layer metallization to reduce shunt capacitance. To enable a hermetic encapsulation, the bond 904 is located over the regions of the ASIC wafer 902 where there is no transistor.

The device layer 906 is fusion-bonded to a via/cap wafer 908. The anchor 910 of the via wafer is also fusion-bonded to the device layer 906 and electrically connected to the device layer 906, where the anchor 910 is electrically isolated by trenches (or vias) 912. Each via 912 includes a core 916 formed of a non-monocrystalline conducting material and electrically insulated by a dielectric layer 914.

The ASIC wafer 902 includes planarized poly-insulator electrodes for driving and sensing MEMS structures formed in the device layer 906. The ASIC wafer 902 also includes diffused hermetic underpasses under the bond 904 to handle high level signals.

FIG. 10 shows the via/cap wafer 908 of FIG. 9, where the via wafer 908 is fabricated by processing a flat DSP wafer via the steps described in conjunction with FIGS. 2D-2J, with the difference that the via wafer 908 may not include any marker mask 210 (FIG. 2C). As such, the process for fabricating the via wafer 908 is not repeated for brevity.

Figure 11A:
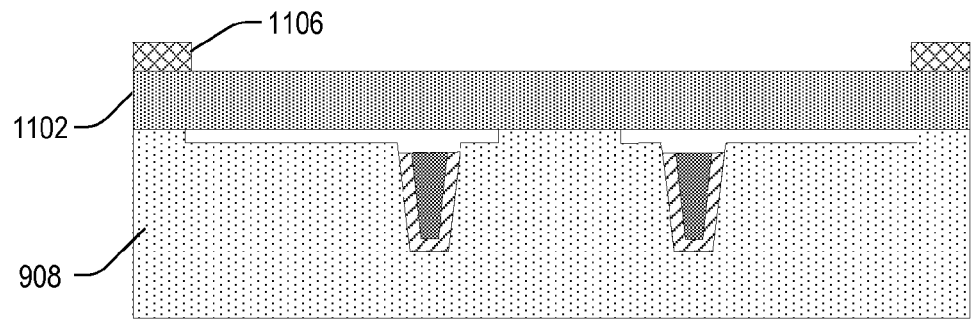
FIGS. 11A-11B show a process for fabricating a device layer of FIG. 9.
Figure 11B:
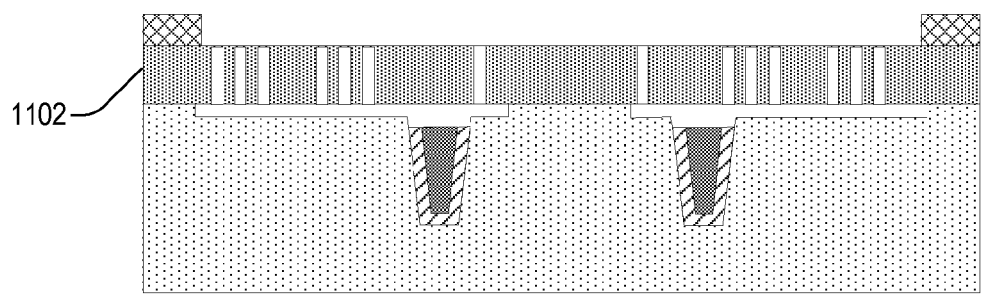

FIGS. 11A-11B show a process for fabricating the device layer 906 of FIG. 9 in accordance with another embodiment of the present invention. As depicted in FIG. 11A, a standard silicon wafer 1102 is fusion bonded (such as silicon-silicon fusion bond) to the via wafer 908. Then, the silicon wafer 1102 may be ground to the thickness of 60 μm and polished by CMP technique. It is noted that a silicon-on-insulator (SOI) vendor could supply a wafer 1102 that is processes to this stage. Then, a bond metal layer 1106 may be deposited and patterned on the wafer 1102. Note that the bond metal layer 1106 is needed if the bond 904 between the ASIC wafer 902 (shown in FIG. 9) and the device layer 906 (shown in FIG. 9) requires metal layers on both sides of the bond.

The silicon wafer 1102 may be patterned and etched to form MEMS structures, as shown in FIG. 11B. The steps for processing the components 1102 and 1106 in FIGS. 11A-11B are similar to those in FIGS. 3A-3B. As such, detailed description of the process in FIGS. 11A-11B is not repeated for brevity.

Figure 12:
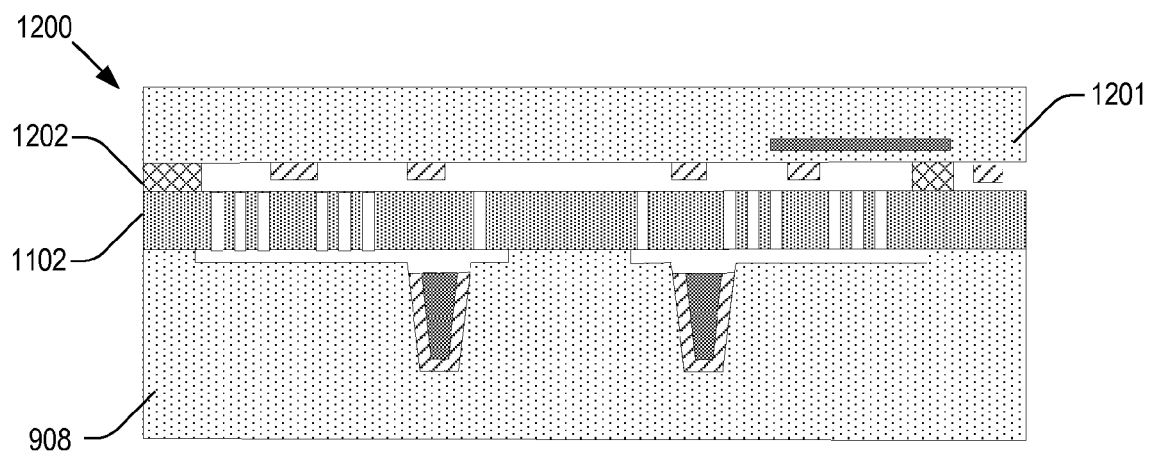
FIG. 12 shows a sensor unit that includes an ASIC wafer that is metal-bonded to the device layer of FIG. 11B.

FIG. 12 shows a sensor unit 1200 that includes an ASIC wafer 1201 that is metal bonded to the device layer 1102. The metal bond 1202 is similar to the metal bond 502 in FIG. 5. As such, detailed description of the bond 1202 is not repeated for brevity.

Figure 13A:
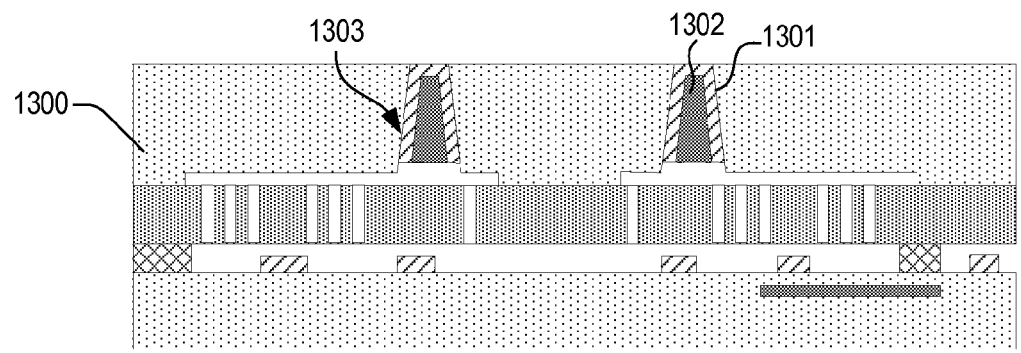
FIGS. 13A-13D show steps for processing the via wafer of FIG. 12.
Figure 13B:
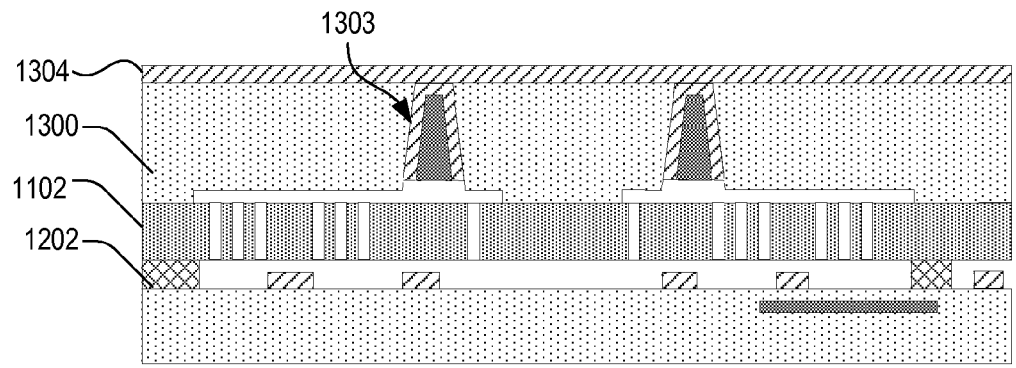

FIGS. 13A-13D show the steps to process the via wafer 908 of FIG. 12 and to make contacts on the via wafer in accordance with another embodiment of the present invention. As depicted in FIG. 13A, the via wafer 1300 is fabricated by grinding the top side (or, equivalently, the via side) of the via wafer 908 (shown in FIG. 12) to the thickness of 350 μm and polishing the top surface. The base oxide layer 1301 of the vias 1303 may be also polished since the conductors 1302 of the vias that may be exposed during the grinding process may be covered again by a dielectric layer 1304, as shown in FIG. 13B. The cores (or, conductors) 1302 of vias 1303 are preferably formed of polysilicon, which is a conducting material.

Figure 13C:
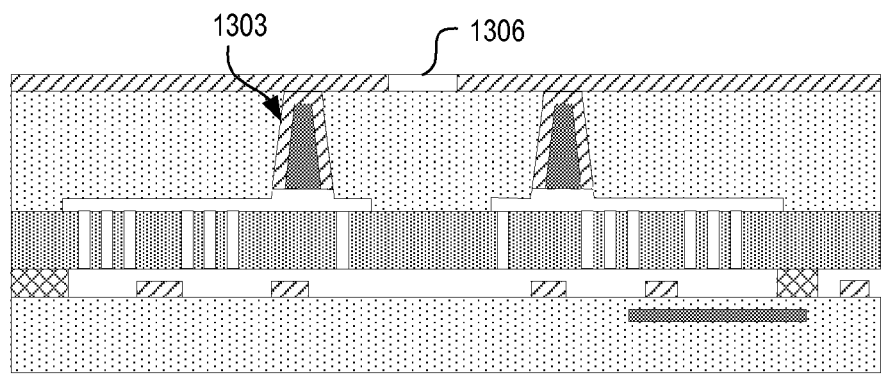
Figure 13D:
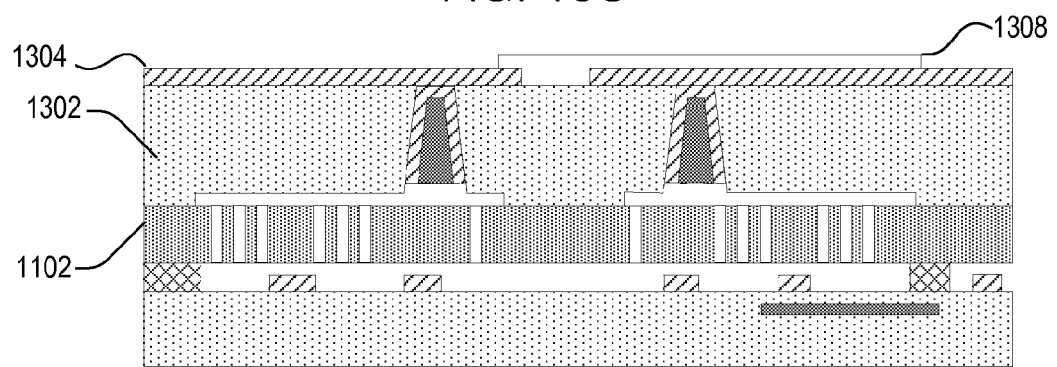

As depicted in FIG. 13B, a dielectric film 1304 may be deposited on the top surface of the via wafer 1300. The dielectric film may be a Plasma Enhanced Chemical Vapor Deposition (PECVD) film, Benzocyclobutene (BCB) film, or any other suitable dielectric film. Then, as depicted in FIG. 13C, the dielectric film 1304 is patterned and etched by a suitable etching technique so that one or more contact openings 1306 are formed in the areas isolated by vias 1303. Next, as depicted in FIG. 13D, contacts 1308 (or, equivalently, metal pads/traces) may be deposited and patterned by a suitable etching technique. For instance, a metal layer may be deposited and patterned by DRIE or RIE technique using a photoresist layer. If the contacts 1308 require ohmic contacts without doping or high temperature anneal, the wafer 1300 may be formed of low resistance silicon.

Figure 14:
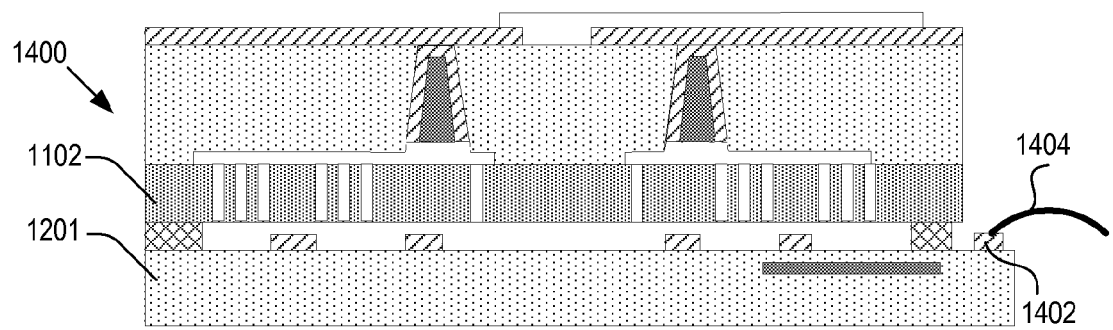
FIG. 14 shows a step for processing the sensor of FIG. 13D.

FIG. 14 shows a schematic diagram of a multi-DOF sensor unit 1400 in accordance with another embodiment of the present invention. The sensor unit 1400 is obtained by etching down one side of the dielectric layer 1304, the via wafer 1302, and the device layer 1102 of FIG. 13, where the etching technique may be a conventional etching technique, such as DRIE or RIE using a photoresist layer. Upon etching, one or more bond pads 1402 of the ASIC wafer 1201 can be accessed for further connection thereto via a wire 1404, for instance. The ASIC wafer 1201 may have a thickness of 410 μm, for instance. As an alternative, double wafer dicing may be used instead of etching down one side of the dielectric layer 1304, the via wafer 1302, and the device layer 1102 of FIG. 13D. In this approach, it is required that all slurry be removed from traces 1308 and bond pads 1402 after dicing. It is noted that the MEMS structures of the device layer 1102 is hermetically sealed by bonding the device layer 1102 to the via wafer 1302 and the ASIC wafer 1201.

Figure 15:
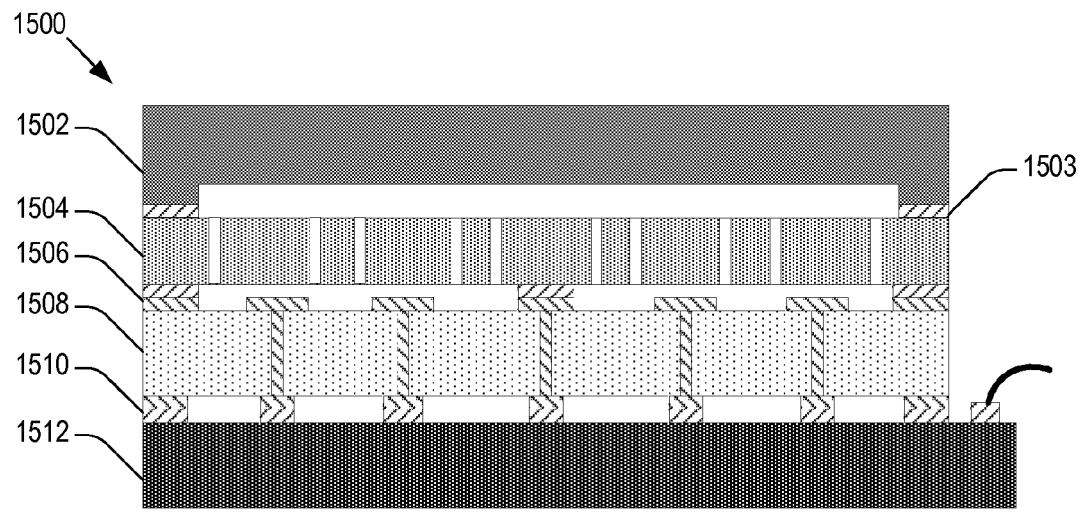
FIG. 15 shows a schematic diagram of a sensor unit in accordance with another embodiment of the present invention.

FIG. 15 shows a schematic diagram of a sensor unit 1500 in accordance with another embodiment of the present invention. As depicted, the sensor unit 1500 may include a cap wafer 1502; a device layer 1504 secured to the cap wafer 1502 by a fusion bond 1503; a via wafer 1508 secured to the device layer 1504 by a metal bond 1506; and an ASCI wafer 1512 secured to the via wafer 1508 by a metal bond 1510 or connected to the via wafer 1508 by bumps. The structure and functions of each component of the unit 1500 are similar to those of its counterpart of the multi-DOF sensor units 22 (shown in FIG. 1C) and 900 (shown in FIG. 9). As such, the description of the components is not repeated for brevity.

Figure 16:
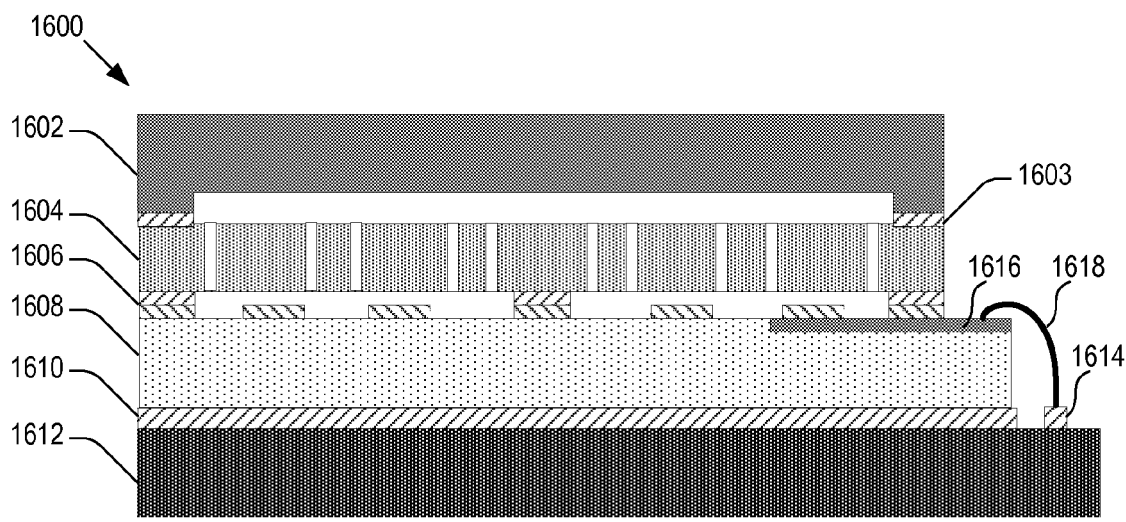
FIG. 16 shows a schematic diagram of a sensor unit in accordance with yet another embodiment of the present invention.

FIG. 16 shows a schematic diagram of a sensor unit 1600 in accordance with another embodiment of the present invention. As depicted, the sensor unit 1600 may include a first cap wafer 1602; a device layer 1604 secured to the first cap wafer 1602 by a fusion bond 1603; a second cap wafer 1608 secured to the device layer 1604 by a metal bond 1606; and an ASIC wafer 1612 secured to the second cap wafer 1608 by a die attaching material 1610. The second cap wafer 1608 may include one or more lateral vias 1616 that may be connected to pads 1614 of the ASIC wafer 1612 by a wire 1618. The structure and functions of each component of the unit 1600 are similar to those of its counterpart of the sensor units 22 (shown in FIGS. 1C) and 900 (shown in FIG. 9). As such, the description of the components is not repeated for brevity.

Figure 17A:
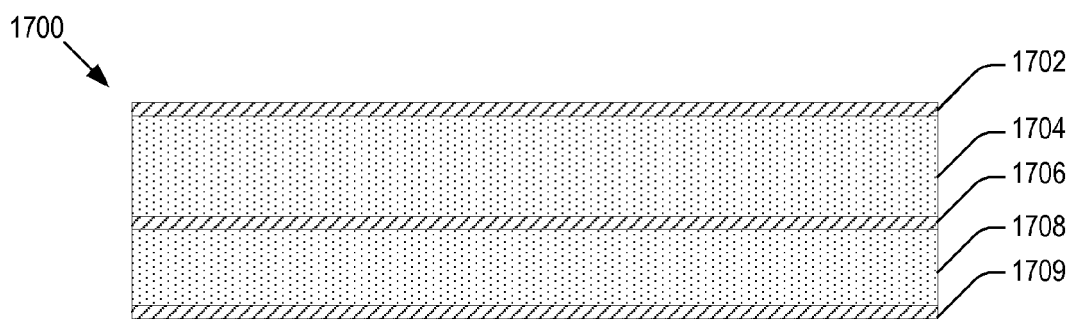
FIGS. 17A-17F show a process for fabricating a via wafer in accordance with still another embodiment of the present invention.

FIG. 17A-17F show a process for fabricating a via wafer in accordance with another embodiment of the present invention. As depicted in FIG. 17A, the process starts with a flat wafer 1700 having a predetermined bulk thickness, preferably 700 μm. The wafer 1700 includes a first silicon layer 1704; a buried oxide layer 1706; a second silicon layer 1708; and two protective oxide layers (or, equivalently, silicon dioxide layers) 1702, 1709 deposited on the top and bottom surfaces of the wafer. The first silicon layer (or, active layer) 1704 may have a thickness of 100-150 μm and its surface may have an arithmetical mean roughness (Ra) of 20 angstroms or less. The first silicon layer 1704 may include P-type dopant silicon, and its resistivity is equal to or less than 0.02 ohm-cm. The bow and warp of the wafer 1700 is less than 50 μm, and the TTV of the wafer is less than 5 μm.

Figure 17B:
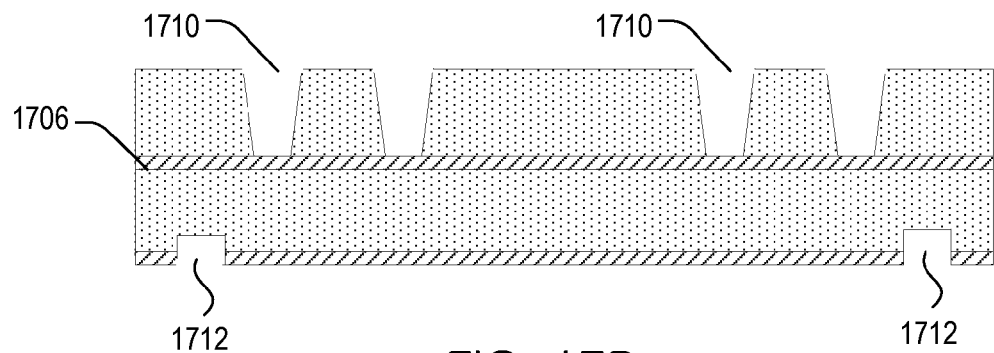

The bottom oxide layer 1709 may be etched to form an etch marker masks 1712, as depicted in FIG. 17B. The process steps for making the masks 1712 are similar to those for making the etch marker mask 210 (FIG. 2C), with the difference that the mask 1712 is formed by etching both the bottom oxide layer 1709 and the second silicon layer 1708. To etch the bottom oxide layer 1709, the conventional buffered-oxide-etch (BOE) technique may be used. Then, the second silicon layer 1708 may be etched by a suitable etching technique, such as DRIE using a patterned photoresist layer, to form the mask 1712.

It is noted that the bottom oxide layer 1709 should be thick enough to stress balance the internal oxide. The stress caused in the via wafer 1700 during the process associated with FIGS. 17B-17E can cause the via wafer to bend and/or warp. The thickness of the oxide layer 1709 is set to maintain the bow and warp of the via wafer below 50 μm upon completion of the process.

As depicted in FIG. 17B, the entire portion of the top oxide layer 1702 may be removed by the BOE technique. Then, the first silicon layer 1704 may be etched by a suitable etching technique, such as DRIE using a patterned photoresist layer, to form the via openings 1710, and the etching may be performed down to the buried oxide layer 1706. The shape and dimensions of the via openings 1710 are similar to those of the via openings 212 (shown in FIG. 2D).

Figure 17C:
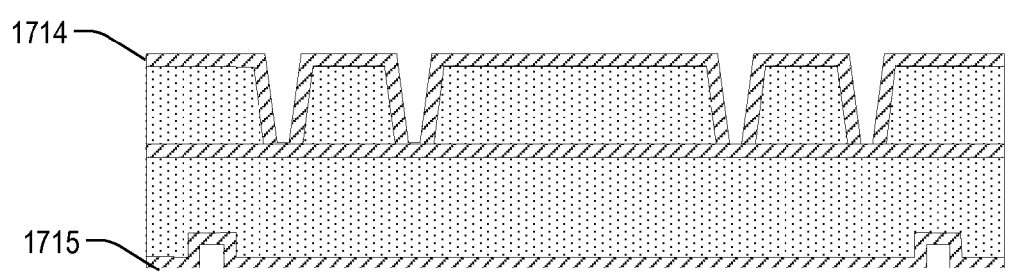
Figure 17D:
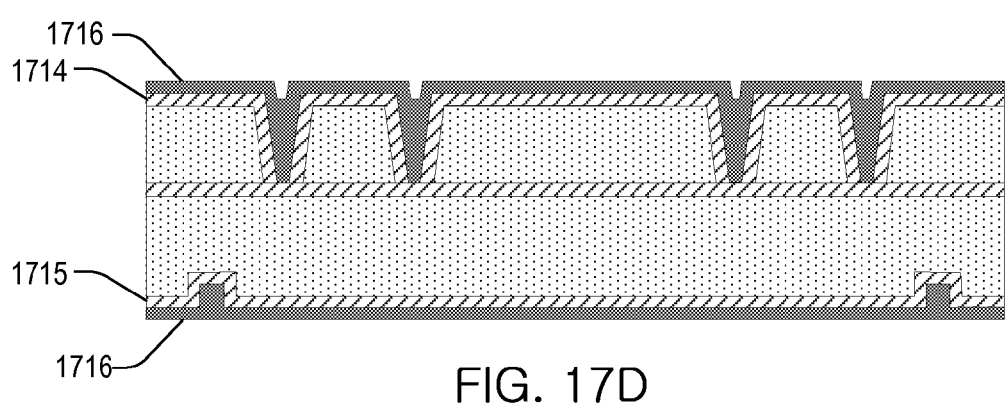
Figure 17E:
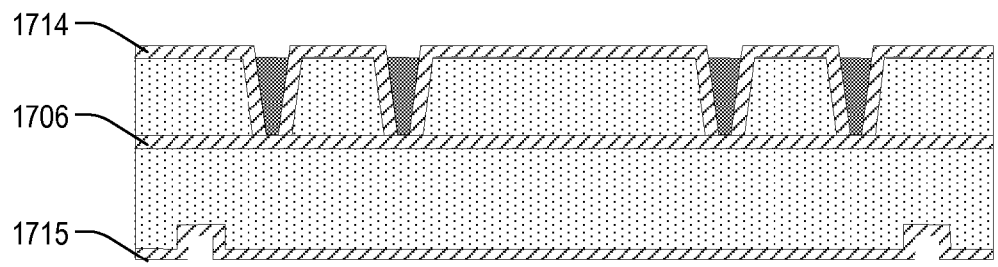
Figure 17F:
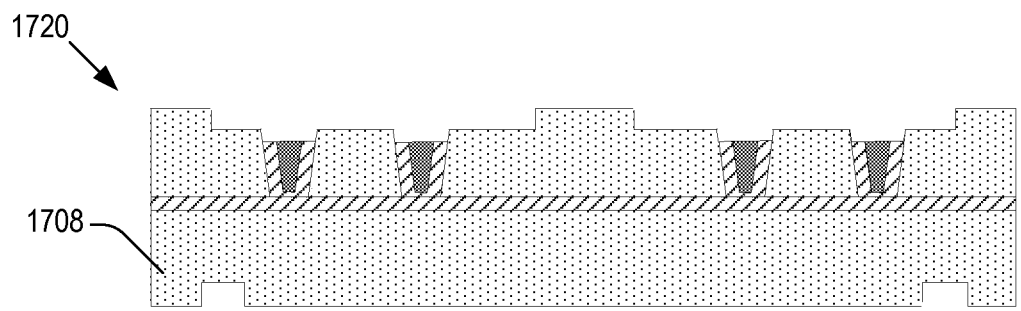

Next, as depicted in FIG. 17C, thermal oxide layers 1714, 1715 are grown on the top and bottom surfaces of the wafer. Subsequently, conformal polysilicon layers 1716 are deposited on the oxide layers 1714 and 1715, as depicted in FIG. 17D. The conformal polysilicon layer 1716 is similar to the silicon layer 214 shown in FIG. 2E and formed of a low stress polysilicon. Then, as depicted in FIG. 17E, the polysilicon layer deposited on the bottom oxide layer is removed. As an alternative, some portion of the bottom oxide layer 1715 may be also removed to balance the stress.

Portions of the polysilicon layer 1716 formed over the top oxide layer 1714 may be removed in the same manner as described in conjunction with FIG. 2F. The wafer shown in FIG. 17E is similar to the wafer shown in FIG. 2F, with the difference that the wafer shown in FIG. 17E includes a buried oxide layer 1706. The wafer in FIG. 17E may be further processed into a wafer 1720 in FIG. 17F via the steps similar to those described in conjunction with FIGS. 2G-2J. As such, the description of the steps for processing the wafer 1720 is not repeated for brevity.

Figure 18:
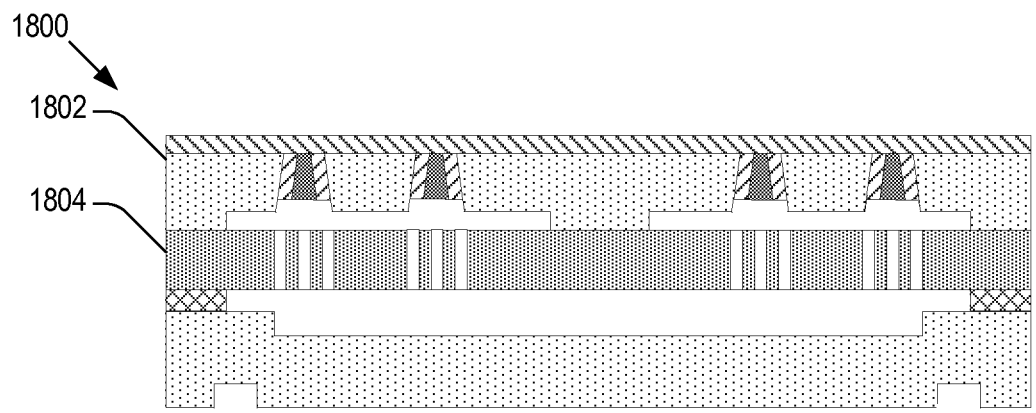
FIG. 18 shows a sensor assembly having the via wafer of FIG. 17F bonded to a device layer in accordance with a further embodiment of the present invention.

FIG. 18 shows a sensor assembly 1800 having a via wafer 1802 bonded to a device layer 1804 in accordance with another embodiment of the present invention. As depicted in FIG. 18, the via wafer 1802 may be made by bonding the via wafer 1720 in FIG. 17F to the device layer 1804 and removing the second silicon layer 1708 by a suitable etching technique. The assembly 1800 is similar to that shown in FIG. 8A, and thus, may be further processed into a multi DOF device (or sensor device) 22 (shown in FIG. 10) via the steps described in conjunction with FIGS. 8B-8C. It is noted that the via wafer 1720 in FIG. 17F may be used, after removing the second silicon layer 1708, in place of the top oxide layer 1304 and the via wafer 1300 in FIG. 13B.

Figure 19:
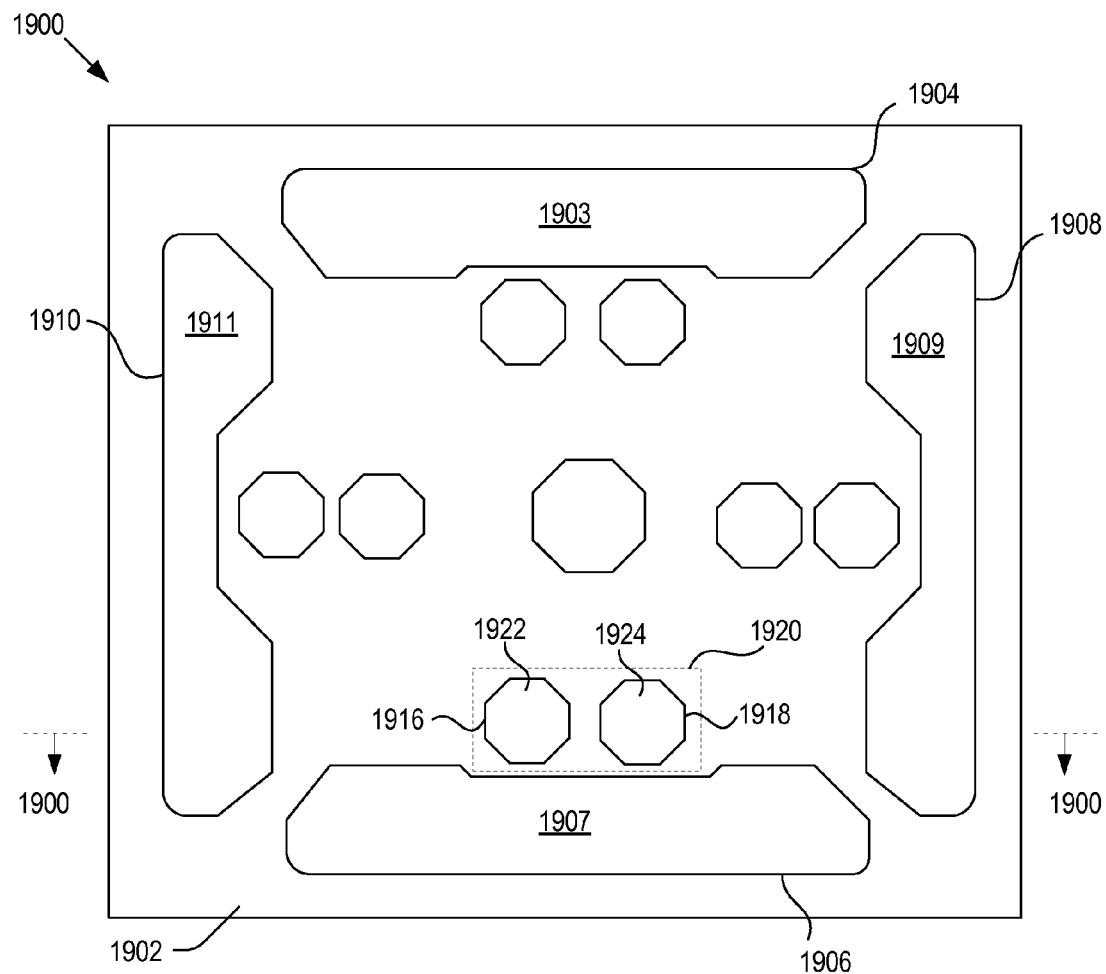
FIG. 19 shows a schematic top view of a via wafer in accordance with yet further another embodiment of the present invention.

FIG. 19 shows a schematic top view of a via wafer 1900 in accordance with yet further another embodiment of the present invention. As depicted, the via wafer 1900 includes multiple regions separated by isolating trenches (or, equivalently, vias). For example, the vias 1904, 1906, 1908, and 1910 respectively form isolated regions (or islands) 1903, 1907, 1909, and 1911, where these islands are electrically isolated from the region 1902. In another example, the vias 1916 and 1918 respectively form isolated islands 1922 and 1924. It is noted that the vias may have other suitable polygonal shapes and each via has a closed loop to define an isolated island.

Figure 20:
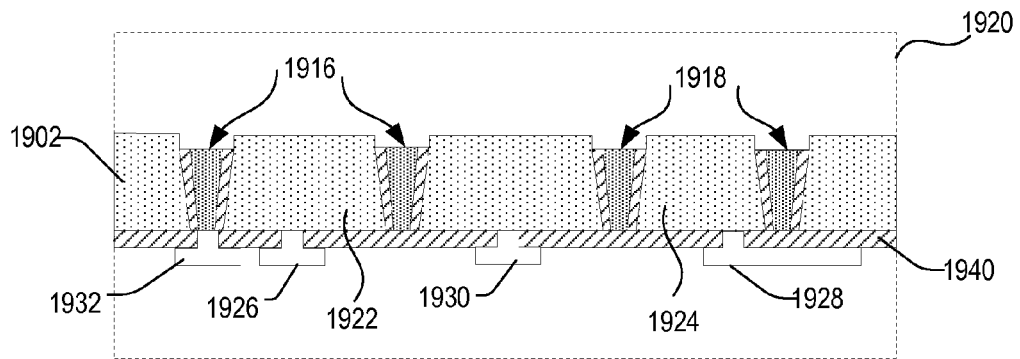
FIG. 20 shows a schematic cross sectional view of the via wafer of FIG. 19, taken along the line 1900-1900.

FIG. 20 shows a schematic cross sectional view of the via wafer 1900 of FIG. 19, taken along the line 1900-1900. For the purpose of illustration, only a portion 1920 of the via wafer is shown in FIG. 20. As depicted, each of the vias 1916 and 1918 includes a conducting core and a dielectric layer for electrically insulating the core. A dielectric layer 1940 may be deposited on the bottom surface of the via wafer 1900. The island 1922 and 1924, isolated by the vias 1916 and 1918, may be electrically connected to other electrical components (not shown in FIG. 20) via traces 1926 and 1928, respectively. Likewise, the region 1902 may be electrically connected to other electrical component (not shown in FIG. 20) via a trace 1930. Also, the core of the via 1916 may be electrically connected to other electrical component via a trace 1932.

Figure 21:
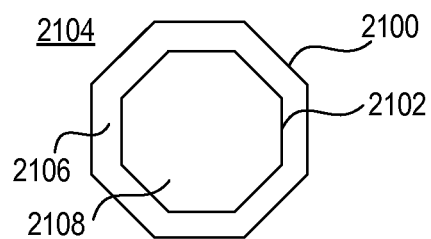
FIG. 21 shows a schematic top view of vias in accordance with still further another embodiment of the present invention.

FIG. 21 shows a schematic top view of vias in accordance with still further another embodiment of the present invention. As depicted, the vias 2100 and 2102 form two isolated islands 2106 and 2108, where the two islands are electrically isolated from the region 2104. Each of the islands 2106 and 2108 may be electrically connected to other electrical component via a trace (not shown in FIG. 21). For instance, the island 2106 surrounding the inner island 2108 has a ring shape and is connected to the ground, while the inner island 2108 may function as a sensor and communicate the measured signal to a signal processor. By grounding the outer island 2106, the inner island 2108 and the outer island 2106 may form a coaxial connection, i.e., the vias 2100 and 2102 form a pair of coaxial vias.

As the vias 2100 and 2102 have the same cross sectional shape as the via 1916, detailed description of the vias 2100 and 2102 is not repeated. It is noted that the vias shown in FIGS. 19-21 may be included in the via wafers depicted in FIGS. 1A-18. It is also noted that the vias shown in FIGS. 19-21 can be fabricated by the processes in FIGS. 2A-2J, 10, and 17A-17F.

It should be understood, of course, that the foregoing relates to exemplary embodiments of the invention and that modifications may be made without departing from the spirit and scope of the invention as set forth in the following claims.

What is claimed is:

1. A device, comprising:
a first wafer having at least one via; and
a second wafer bonded to the first wafer and having a micro-electromechanical-systems (MEMS) layer,
wherein the via forms a closed loop when viewed in a direction normal to a top surface of the first wafer to thereby define a first conductive region of the first wafer electrically isolated from the remainder of the first wafer.

2. A device of claim 1, wherein the MEMS layer is adapted to measure one or more of angular rates about three axes and linear accelerations about the three axes.

3. A device as recited in claim 1, wherein the first wafer includes a dielectric layer formed on a surface thereof and one or more contacts disposed over the dielectric layer, one of the contacts being electrically connected to the first conductive region.

4. A device as recited in claim 1, wherein the via includes a core filled with an electrically conducting material and a dielectric layer surrounding the core.

5. A device as recited in claim 4, wherein the first wafer includes a dielectric layer formed on a surface thereof and one or more contacts disposed over the dielectric layer, one of the contacts being electrically connected to the core of the via.

6. A device as recited in claim 1, wherein the first wafer includes first and second vias, the first via forming a first closed loop to define a first conductive region, the second via forming a second closed loop surrounding the first closed loop to thereby define a second conductive region having a ring shape and electrically insulated from the first conductive region.

7. A device as recited in claim 6, wherein the first and second conductive regions are respectively connected to first and second contacts, the first conductive region being adapted to operate as a sensor and communicate a signal via the first contact, the second conductive region being connected to a ground via the second contact.

8. A device as recited in claim 1, further comprising:
a third wafer bonded to the first and second wafers.

9. A device as recited in claim 8, further comprising:
an ASIC wafer bonded to the first wafer.

10. A device as recited in claim 1, wherein at least one of the first and second wafers includes a cavity to thereby cause portions of the first wafer to be spaced apart from the second wafer.

* * * * *